(12) United States Patent
Horii et al.

(10) Patent No.: US 7,511,986 B2
(45) Date of Patent: Mar. 31, 2009

(54) SEMICONDUCTOR MEMORY DEVICE

(75) Inventors: Shinji Horii, Tenri (JP); Satoru Yamagata, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 11/826,613

(22) Filed: Jul. 17, 2007

(65) Prior Publication Data
US 2008/0025070 A1    Jan. 31, 2008

(30) Foreign Application Priority Data
Jul. 31, 2006    (JP)    ............... 2006-208345

(51) Int. Cl.
*G11C 11/00* (2006.01)
(52) U.S. Cl. ............... 365/148; 365/158; 365/171
(58) Field of Classification Search ............. 365/148, 365/158, 171, 173
See application file for complete search history.

(56) References Cited

U.S. PATENT DOCUMENTS

| 6,995,999 | B2 | 2/2006 | Morimoto | |
| 7,002,837 | B2 * | 2/2006 | Morimoto | 365/148 |
| 7,057,922 | B2 * | 6/2006 | Fukumoto | 365/158 |
| 7,242,606 | B2 * | 7/2007 | Hachino et al. | 365/148 |
| 2006/0158922 | A1 | 7/2006 | Takemura | |

FOREIGN PATENT DOCUMENTS

| JP | 2005-25914 A | 1/2005 |
| JP | 2006-013016 | 1/2006 |
| JP | 2006-179158 A | 7/2006 |

* cited by examiner

*Primary Examiner*—Anh Phung
*Assistant Examiner*—Hien N Nguyen
(74) *Attorney, Agent, or Firm*—Nixon & Vanderhye, PC

(57) ABSTRACT

The possibility of the loss of information stored in a memory cell which is caused by repeating the reading action on the same memory cell comprising a variable resistance element and a select transistor can significantly be reduced. A voltage applying circuit for selecting one or more of the memory cells from a memory cell array and applying voltages to the word lines, bit lines, and source lines for programming, erasing, and reading information applies a voltage between the bit line and the source line connected to the selected memory cell so that the voltage applied between the two ports of the variable resistance element in the selected memory cell during the reading action is equal in the polarity to one of the voltages applied between the two ports of the variable resistance element for the programming action and the erasing action respectively whichever is greater in the absolute value.

7 Claims, 23 Drawing Sheets

Voltage Application between Two Ports of Variable Resistance Element (Absolute Value)

SEMICONDUCTOR MEMORY DEVICE

CROSS REFERENCE TO RELATED APPLICATION

This Nonprovisional application claims priority under 35 U.S.C. §119(a) on Patent Application No. 2006-208345 filed in Japan on 31 Jul., 2006 the entire contents of which are hereby incorporated by reference.

BACKGROUND OF THE INVENTION

1. Field of the Invention

The present invention relates to a semiconductor memory device provided with a memory cell including a variable resistance element having two terminals, that can store information by varying its electric resistance between a first state and a second state when voltage having different polarities are separately applied to both ends thereof, and a select transistor whose source or drain is connected to one end of the variable resistance element.

2. Description of the Related Art

Nonvolatile semiconductor memory devices including typically flash memories have widely been marketed for use in computers, communications apparatuses, measuring apparatuses, automatic controlling apparatuses, and house-hold appliances designed for personal use, as they are large in the storage capacity and small in the overall size. There is an increasing demand for providing less expensive, larger storage size nonvolatile semiconductor memory devices. This is because such nonvolatile semiconductor memory devices are electrically writable and capable of holding data when they have been de-energized and can thus be functioned as nonvolatile data storages or program storages where initial settings for operating the apparatuses are stored in portable apparatuses such as memory cards or mobile telephones.

Also, as some other types of the nonvolatile semiconductor memories have been proposed employing novel materials, one of them is promisingly known an RRAM (resistance random access memory). The RRAM is based on a variable resistance element for changing the resistance to develop a memory function when receiving a current greater than the read current and favorable for future use as improved in the operation speed, the storage size, the power consumption, and the performance potential.

Disclosed in Japanese Patent Laid-open Publication No. 2004-185755 (referred to as a prior art citation hereinafter) is a type of RRAM which comprises one or more arrays of nonvolatile memory cells, each cell including a variable resistance element, arranged in rows and columns and accompanied with a number of word lines and a number of bit lines arranged along the rows and the columns respectively for selecting one or more of the memory cells.

For instance, the variable resistance element of each memory cell in the RRAM is connected at one end to the source (or the drain) of a select transistor for storage of information through varying the electrical resistance. Also in the memory cell array, either the other end of the variable resistance element or the drain (or the source) of the select transistor is connected to a common bit line extending along one column while the other is connected to a common source line. The gate of the select transistor is connected to a common word line extending along one row. When the word line, the bit line, and the source line connected to its memory cell array of interest in the above arrangement are applied with their respective levels of the voltage determined to match the requirements of voltage application, the stored data in the memory cell can be written or read out.

For example, the memory cells in the memory cell array of the prior art citation are shown in FIG. 23. More particularly, as shown in FIG. 23, the variable resistance element 11 is connected at one end to the source of the select transistor 12 to build up a memory cell 10. The variable resistance elements 11 are connected at the other end to source lines SL1, SL2 while the select transistors 12 are connected at the drain to bit lines BL1 to BL4. Since the memory cell in the prior art citation is composed mainly of a series circuit of the variable resistance element and the select transistor, its select transistors aligned along an unselected row remain turned off (not conducted) thus to disconnect the current path which extends through the variable resistance elements in the memory cells other than the selected memory cell. This prevents the unselected memory cells connected to the same bit lines from interrupting the read action of the selected memory cell. Moreover, since the select transistor is connected between the bit lines and the variable resistance element in each memory cell, the variable resistance elements in the unselected memory cells are electrically isolated from the bit lines along the selected column to which the readout voltage is applied. This permits the variable resistance elements to remain free from any stress of the voltage, thus increasing the reliability in the data storage performance.

The RRAM in the prior art citation is proposed in which the variable resistance element is varied in the electric resistance by the action of electrical stress and its resistance level remains held after the removal of the electrical stress. The variable resistance element is made of, for example, an oxide material of a perovskite structure containing manganese which may be selected from $Pr_{(1-x)}Ca_xMnO_3$, $La_{(1-x)}Ca_xMnO_3$, $La_{(1-x-y)}Ca_xPb_yMnO_3$ (where x<1, y<1, and x+y<1), $Sr_2FeMoO_6$, and $Sr_2FeWO_6$, or more specifically $Pr_{0.7}Ca_{0.3}MnO_3$, $La_{0.65}Ca_{0.35}MnO_3$, and $La_{0.65}Ca_{0.175}Pb_{0.175}MnO_3$ in manganese oxide layer form.

The reading action on the memory cell array shown in FIG. 23 will now be described. The action starts with making the bit line select transistor 4 conductive which is connected to the selected bit line in order to supply the selected bit line connected to the memory cell to be read with a bias voltage. Simultaneously, the selected word line connected to the gate of the select transistor 3 in the memory cell to be read is turned to the high level by a word line driver 5 in order to make the select transistor 3 conductive. In addition, the source line is supplied with a reference voltage or 0 V (of the grounding voltage). As the result, a current path for the reading action is established extending from the selected bit line at the bias voltage through the select transistor 3 and the variable resistance element 2 in the memory cell to be read to the source line at the grounding voltage level. Meanwhile, as for the unselected memory cells, the unselected word lines are turned to the low level, for example, 0 V by the word line driver 5 and the unselected bit lines are turned to the low level, for example, 0 V or the open state (at a high impedance level). As a result, there is no current path from the selected bit line to the source line other than the current path for the reading action to pass through the variable resistance element in the memory cell to be read. As the change in the electric resistance in the variable resistance element in the memory cell to be read is interpreted to a change in the current which runs through the bit line in response to the application of voltages across the bit line, the word line, an the source line, the current change is analyzed by the readout circuit thus to correctly pick the information from the memory cell to be read. Moreover, since the variable resistance elements in the unselected memory cells and the selected bit line are electrically disconnected, the variable resistance elements in the unselected memory cells directly receive no voltage stress from the bit line even if the reading action is repeatedly carried out with the same bit line. Accordingly, any change in the resistance of the variable resistance element or the erase or the loss of information stored in the variable resistance element caused by the voltage stress will significantly be minimized. In other words, the semiconductor memory device will be improved in the reliability of data storage.

However, the semiconductor memory device described above is contemplated for inhibiting the loss of information stored in the memory cells not to be read during the reading action on the selected memory cell to be read but fails to avoid the loss of information stored in the selected memory cell to be read. Accordingly, when the selected memory cell to be read is repeatedly subjected to the reading action a number of times, its stored information may be lost due to a change in the resistance caused by the readout voltage which is applied directly to the variable resistance element, whereby its reliability of data storage will be declined.

The prior art citation protects the variable resistance element in the memory cell not to be read from directly receiving a stress of voltage from the bit line and can thus inhibit any change in the resistance or the loss of information stored in the variable resistance element. It can however fail to eliminate the probability of the loss of information stored in the variable resistance element in the selected memory cell to be read.

The loss of information stored in the selected memory cell may be triggered by the fact that, while the writing action on the variable resistance element is carried out through varying the resistance level of the variable resistance element or more particularly applying a first readout voltage to between the two ports of the variable resistance element for shifting the resistance level from a first state to a second state and applying a second readout voltage for shifting the resistance level from the second state to the first state, the action of reading the resistance level of the variable resistance element is equally carried out through applying the readout voltage to between the two ports of the variable resistance element. In brief, the loss may be caused by the voltage application to the variable resistance element which is carried out in the writing action and the reading action element in the same way although the absolute values of the applied voltages are different between the actions. Accordingly, when the reading action is repeatedly conducted, the resistance level or the information stored in the variable resistance element may be lost at higher possibility.

SUMMARY OF THE INVENTION

The present invention has been developed in view of the above aspects and its object is to provide a semiconductor memory device which is significantly reduced in the possibility of the loss of information stored in a memory cell caused by repeating the reading action on the same memory cell equipped with a variable resistance element and a select transistor and thus improved in the information storage property.

For achievement of the object, a semiconductor memory device according to the present invention is provided as a first feature comprising: an array of memory cells arranged in a row direction and a column direction, each memory cell including a series circuit of a variable resistance element of two-port structure type and a select transistor of MOSFET type, the select transistor connected at its drain or source to one port of the variable resistance element, the select transistors in the memory cells aligned along one row connected at its gate to a common word line extending along the row direction, the memory cells aligned along one column connected at its one end to a common bit lines extending along the column direction, each of the memory cells connected at the other end to a source line extending along the row direction or the column direction; and a voltage applying circuit for selecting one or more of the memory cells from the memory cell array and applying predetermined voltages to the word line, bit line, and source line to conduct actions of writing and reading information stored in a selected memory cell, wherein the variable resistance element is a nonvolatile memory element capable of storing and writing information electrically by shifting an electric resistance level from a first state to a second state when a first write voltage is applied to between the two ports and shifting the electric resistance level from the second state to the first state when a second write voltage which is different in the polarity and the absolute value from the first write voltage is applied to between the two ports, and in a first writing action of shifting an electric resistance in the variable resistance element in the selected memory cell from the first state to the second state, the voltage applying circuit applies a first voltage at positive or negative polarity to between the bit line and the source line both connected to the selected memory cell with reference to the source line and a predetermined word line voltage to the word line connected to the gate of the select transistor in the selected memory cell and thus applies the first voltage to between the two ports of the variable resistance element in the selected memory cell, and in a second writing action of shifting the electric resistance in the variable resistance element in the selected memory cell from the second state to the first state, the voltage applying circuit applies a second voltage which is opposite in the polarity to the first voltage to between the bit line and the source line both connected to the selected memory cell with reference to the source line and a predetermined word line voltage to the word line connected to the gate of the select transistor in the selected memory cell and thus applies the second write voltage to between the both ports of the variable resistance element in the selected memory cell, and in the reading action, the voltage applying circuit applies a third voltage equal in the polarity to a reference write voltage, which is either the first write voltage for the first writing action or the second write voltage for the second writing action whichever is greater in the absolute value, to between the bit line and the source line connected to the selected memory cell with reference to the source line and a predetermined word line voltage to the word line connected to the gate of the select transistor in the selected memory cell and thus applies a readout voltage which is lower in the absolute value than the reference write voltage to between the two ports of the variable resistance element in the selected memory cell.

According to the semiconductor memory device of the first feature, the variable resistance element, where the write voltage is different in the polarity and the absolute value between the first writing action for shifting the resistance level from the first state to the second state and the second writing action for shifting the resistance level from the second state to the first state, is supplied between the two ports with the readout voltage during the reading action at the same polarity as the reference write voltage applied to between the two ports of the variable resistance element during the writing action where the absolute value of the write voltage is greater. This allows a difference between the reference write voltage and the readout voltage to be increased, hence preventing the resistance level in the selected memory cell from gradually changing to the opposite end due to the application of the readout voltage. Accordingly, the loss of information stored in the memory cell will be avoided during the reading action, hence permitting the data storage property to be improved.

In addition to the first feature, the semiconductor memory device according to the present invention may be modified as a second feature in which the memory cell includes a series circuit where the variable resistance element is connected at its one port to the source of the select transistor, each of the select transistors in the memory cells aligned along one column is connected at its drain to the common bit line and each of the variable resistance elements in the memory cells is connected at the other port to the source line in the memory cell array, the variable resistance element is a nonvolatile memory element for shifting the electric resistance level from a first state to a second state when receiving a first write voltage between the two ports and shifting the electric resistance level from the second state to the first state when receiving a second write voltage which is opposite in the polarity to and smaller in the absolute value than the first write voltage between the two ports, and thus can electrically store and write information, and in the first writing action, the voltage applying circuit applies a first voltage at the positive polarity with reference to the bit line to between the bit line and the source line both connected to the selected memory cell and a predetermined word line voltage to the word line connected to the gate of the select transistor in the selected memory cell, and thus applies the first write voltage to between the two ports of the variable resistance element in the selected memory cell, and in the second writing action, the voltage applying circuit applies a second voltage at the positive polarity with reference to the source line to between the bit line and the source line both connected to the selected memory cell and a predetermined word line voltage to the word line connected to the gate of the select transistor in the selected memory cell, and thus applies the second write voltage to between the two ports of the variable resistance element in the selected memory cell, and in the reading action, the voltage applying circuit applies a third voltage at the positive polarity with reference to the bit line to between the bit line and the source line both connected to the selected memory cell and a predetermined word line voltage to the word line connected to the gate of the select transistor in the selected memory cell, and thus applies the readout voltage which is lower in the absolute value than the first write voltage to between the two ports of the variable resistance element in the selected memory cell.

According to the semiconductor memory device of the second feature, the select transistor is located at the bit line side of the memory cell and requires its source voltage to be lower than the voltage determined by subtracting the threshold voltage from the word line voltage applied to the gate of the select transistor for becoming conductive in the second writing action. This allows the second write voltage applied to the variable resistance element between the two ports to be lower than the voltage determined by subtracting the threshold voltage of the select transistor from the word line voltage with reference to the source line. On the other hand, the first write voltage applied to the variable resistance element between the two ports for the first writing action is lower than the first voltage since the source voltage of the select transistor is allowed to lower down to the bit line voltage level. As the result, the variable resistance element has the write voltage attribute such that the absolute value of the second write voltage is smaller than the absolute value of the first write voltage. When the difference in the absolute value between the first write voltage and the second write voltage has been offset by the voltage drop equal to the threshold voltage, the first voltage for the first writing action and the second voltage for the second writing action are identical to each other in the absolute value to be applied between the bit line and the source line and become thus compatible for use in the writing action. As the number of types of the voltage to be handled in the voltage applying circuit is minimized, the peripheral circuit can be simplified in the arrangement.

The semiconductor memory device according to the present invention may further be modified as a third feature in addition to the second feature wherein the voltage applying circuit applies the grounding voltage to the bit line in the first writing action and the reading action, and the grounding voltage to the source line in the second writing action.

According to the semiconductor memory device of the third feature, the voltage to be applied is compatible between the writing action and the reading action. As the number of types of the voltage to be handled in the voltage applying circuit is further minimized, the peripheral circuit can be simplified in the arrangement.

Moreover in addition to the first feature, the semiconductor memory device according to the present invention may be modified as a fourth feature in which the memory cell includes a series circuit where the variable resistance element is connected at one port to the drain of the select transistor, and each of the select transistors in the memory cells aligned along one column is connected at its source to the common source line and each of the variable resistance elements in the memory cells is connected at the other port to the bit line in the memory cell array, the variable resistance element is a nonvolatile memory element for shifting the electric resistance level from a first state to a second state when receiving a first write voltage between the two ports and shifting the electric resistance level from the second state to the first state when receiving a second write voltage which is opposite in the polarity to and greater in the absolute value than the first write voltage between the two ports, and thus can electrically store and write information, and in the first writing action, the voltage applying circuit applies a first voltage at the positive polarity with reference to the bit line between the bit line and the source line both connected to the selected memory cell and a predetermined word line voltage to the word line connected to the gate of the select transistor in the selected memory cell, and thus applies the first write voltage to between the two ports of the variable resistance element in the selected memory cell, and in the second writing action, the voltage applying circuit applies a second voltage at the positive polarity with reference to the source line to between the bit line and the source line both connected to the selected memory cell and a predetermined word line voltage to the word line connected to the gate of the select transistor in the selected memory cell, and thus applies the second write voltage to between the two ports of the variable resistance element in the selected memory cell, and in the reading action, the voltage applying circuit applies a third voltage at the positive polarity with reference to the source line to between the bit line and the source line both connected to the selected memory cell and a predetermined word line voltage to the word line connected to the gate of the select transistor in the selected memory cell, and thus applies the readout voltage which is lower in the absolute value than the second write voltage to between the two ports of the variable resistance element in the selected memory cell.

According to the semiconductor memory device of the fourth feature, the select transistor is located at the source line side of the memory cell and requires its drain voltage to be lower than the voltage determined by subtracting the threshold voltage from the word line voltage applied to the gate of the select transistor for becoming conductive in the first writing action. This allows the first write voltage applied to the variable resistance element between the two ports to be lower than the voltage determined by subtracting the threshold voltage of the select transistor from the word line voltage with reference to the bit line. On the other hand, the second write voltage applied to the variable resistance element between the two ports in the second writing action is lower than the second voltage since the drain voltage of the select transistor is allowed to lower down to the source line voltage level. As the result, the variable resistance element has the write voltage attribute such that the absolute value of the second write voltage is greater than the absolute value of the first write voltage. When the difference in the absolute value between the first write voltage and the second write voltage has been offset by the voltage drop equal to the threshold voltage, the first voltage for the first writing action and the second voltage for the second writing action are identical to each other in the absolute value to be applied to between the bit line and the source line and become thus compatible for use in the writing action. As the number of types of the voltage to be handled in the voltage applying circuit is minimized, the peripheral circuit can be simplified in the arrangement.

The semiconductor memory device according to the present invention may further be modified as a fifth feature in addition to the fourth feature wherein the voltage applying circuit applies the grounding voltage to the bit line in the first writing action and the grounding voltage to the source line in the second writing action and the reading action.

According to the semiconductor memory device of the fifth feature, the voltage to be applied is compatible between the writing action and the reading action. As the number of types of the voltage to be handled in the voltage applying circuit is further minimized, the peripheral circuit can be simplified in the arrangement.

The semiconductor memory device according to the present invention may further be modified as a sixth feature in addition to any of the foregoing features wherein the select transistor is an n-channel MOSFET of enhancement type.

According to the semiconductor memory device of the sixth feature, the select transistor is a MOSFET of enhancement type which is commonly used as the peripheral circuit of a semiconductor memory device and thus needs not to employ a specific transistor for the memory cell. This allows the semiconductor memory device to be simplified in the steps of its production, thus contributing to the production cost down.

The semiconductor memory device according to the present invention may further be modified as a seventh feature in addition to any of the foregoing features wherein a gate insulating layer of the select transistor has the same thickness as a transistor gate insulating layer of a transistor constituting peripheral circuits including the voltage applying circuit.

According to the semiconductor memory device of the seventh feature, the select transistor in the memory cell and the transistor constituting the peripheral circuit can be fabricated in the same manufacturing process. This allows the semiconductor memory device to be simplified in the steps of its production, thus contributing to the production cost down.

DETAILED DESCRIPTION OF THE INVENTION

Some embodiments of the semiconductor memory device according to the present invention (referred to as an inventive device hereinafter) will be described referring to the relevant drawings.

FIRST EMBODIMENT

Figure 1:
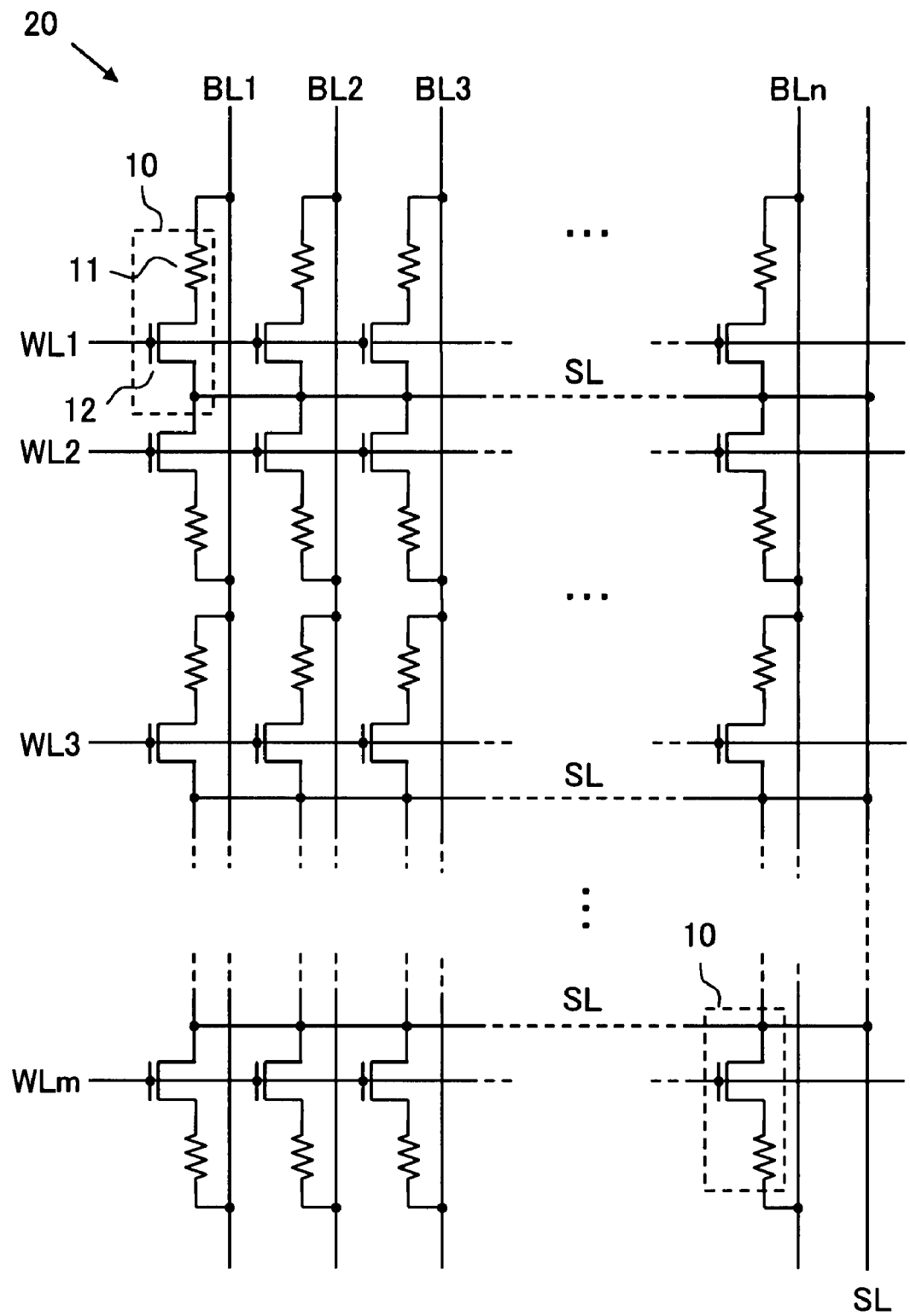
FIG. 1 is a circuitry diagram schematically showing an arrangement of the memory cell array in a semiconductor memory device according to the first embodiment of the present invention.

The inventive device of this embodiment comprises, as shown in FIG. 1, one or more memory cell arrays 20 where a number of memory cells 10 are arranged in rows and columns and groups of words lines WL1 to WLm and bit lines BL1 to BLn arranged to extend along the rows and the columns respectively for selectively driving one or more of the memory cells of interest while a group of source lines SL is arranged to extend along the rows. Although the source lines SL extend along the rows in parallel to the word lines WL1 to WLm, each source line in each row, and are connected commonly at the outside of the memory cell array 20 in the embodiment shown in FIG. 1, they may be modified to one source line SL provided commonly for two adjacent word lines or may extend along the columns but not the rows. Alternatively, each memory cell array 20 may be accompanied with two or more of the source lines SL for selectively driving one or more of the memory cells of interest in cooperation with the word lines and the bit lines.

Moreover, the memory cell array 20 is not limited to the arrangement of FIG. 1 in the form of an equivalent circuit but may be constructed in any combination as long as its memory cell 10 comprising a variable resistance element 11 and a select transistor 12 is connected with the word line, the bit line, and the source line and constitutes a memory cell array. The inventive device is not limited to any particular arrangement of the memory cell array 20.

The memory cell 10 in the inventive device includes a series circuit where the variable resistance element 11 is connected at one end to the drain of the select transistor 12 and at the other end to one of the bit lines BL1 to BLn. The select transistor 12 is connected at the source to the source line SL and at the gate to one of the word lines WL1 to WLm. The variable resistance element 11 is a nonvolatile resistance element of a two-port structure which is arranged for, when receiving a first write voltage between its two ports, shifting the resistance level from a first state (for example, the low resistance level) to a second state (for example, the high resistance level) and when receiving between its two ports a second write voltage which is opposite in the polarity to and greater in the absolute value than the first write voltage, shifting from the second state to the first state in order to save a piece of information. The select transistor 12 is a MOSFET which is identical to that provided in a peripheral circuit of the memory cell array 20 which will be described later, more particularly an n-channel MOSFET of enhancement type of which the source and drain are of N conductive type and the threshold voltage is positive (for example, +0.1 V to +1.0 V or preferably +0.5 V).

While MOSFET is commonly arranged with two impurity diffused regions sandwiching the gate acting as the drain and the source, its drain and source may be determined from the two impurity diffused regions depending on the circuitry arrangement. It is assumed in the inventive device that the one of the two impurity diffused regions located close to the bit line is the drain and the other located close to the source line is the source. Even when the drain and the source are reversed to each other, their fundamental function remains unchanged.

Figure 2:
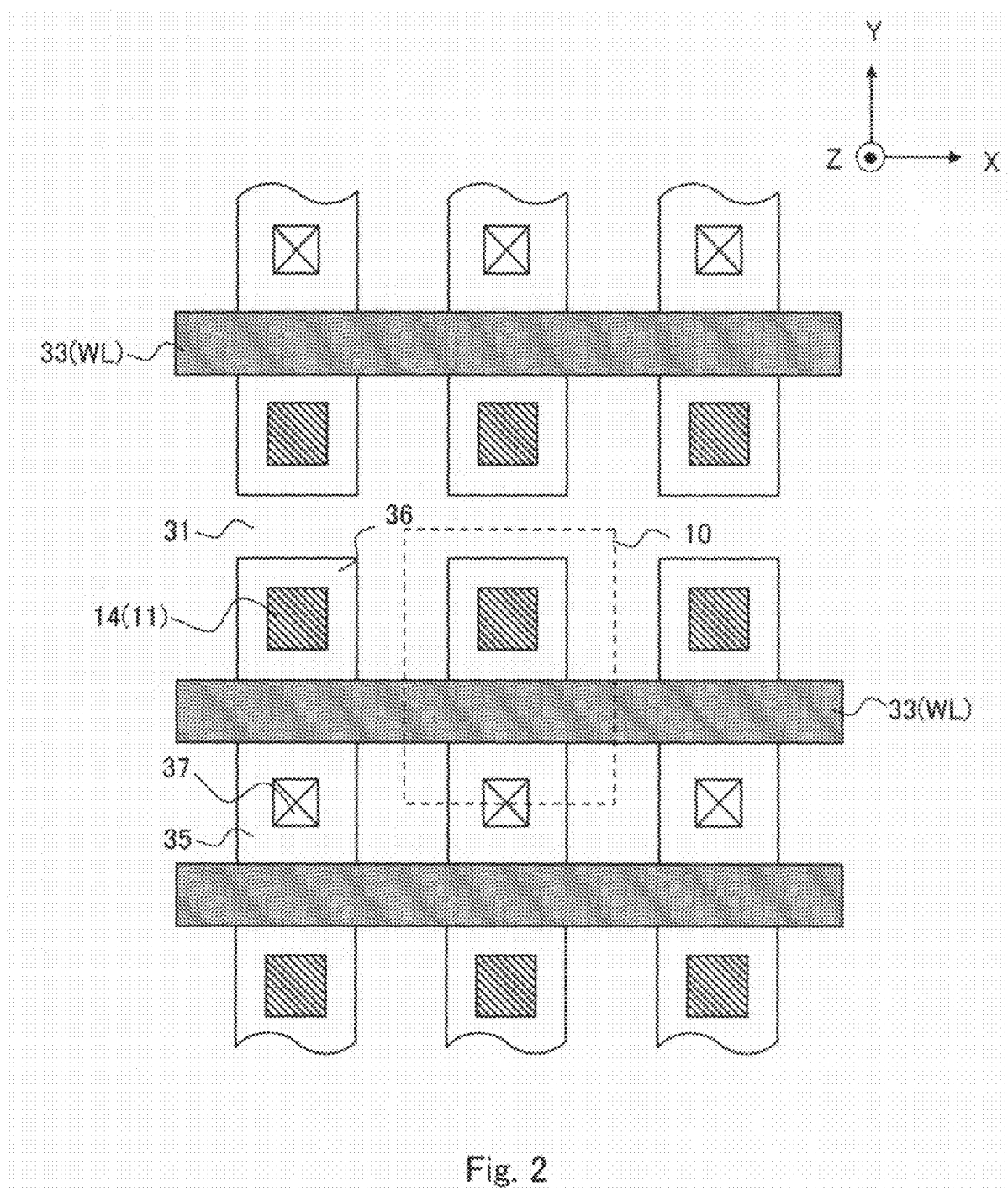
FIG. 2 is a general plan view schematically showing a plan arrangement of the memory cells in the memory array of the semiconductor memory device according to the first embodiment of the present invention.
Figure 3:
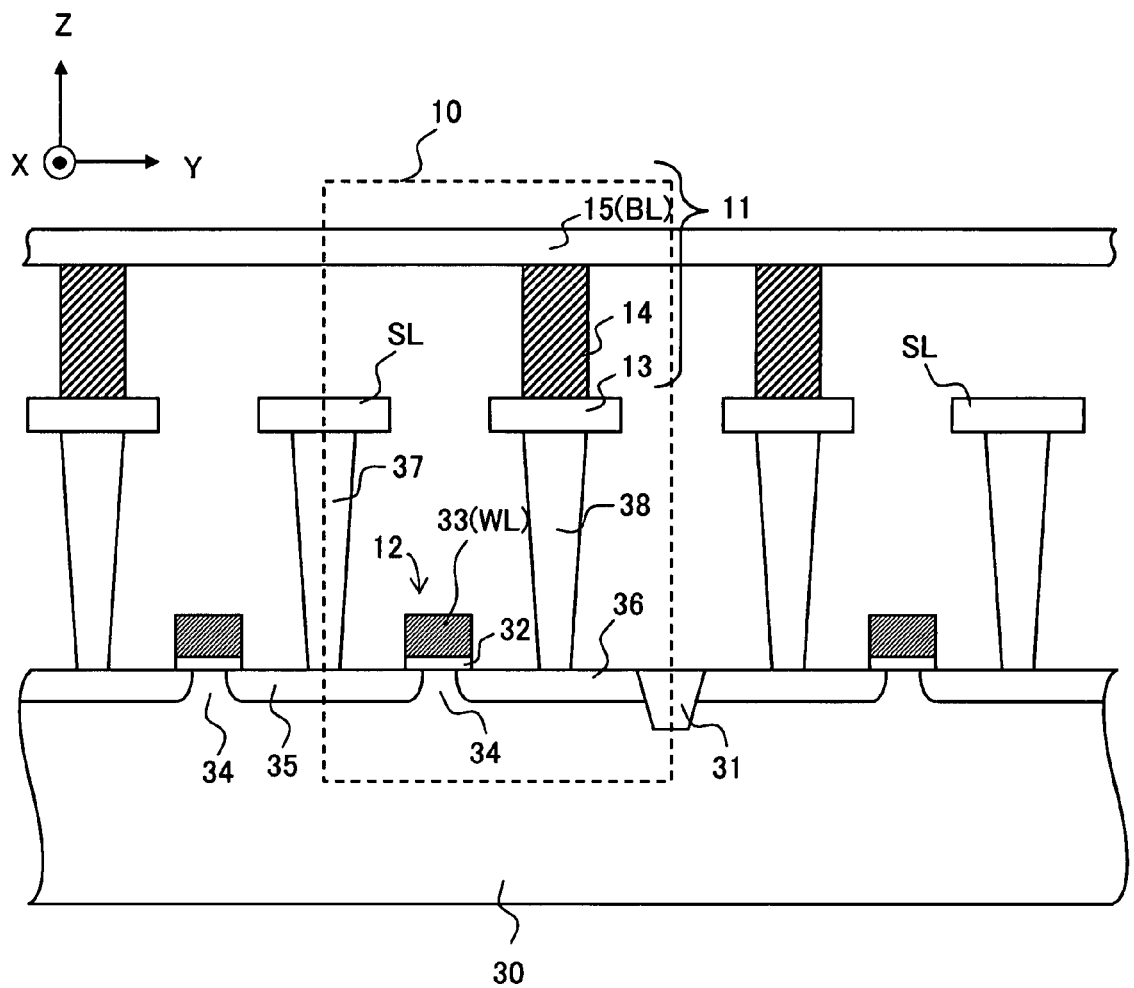
FIG. 3 is a general cross sectional view schematically showing the cross section of the memory cells in the memory array of the semiconductor memory device according to the first embodiment of the present invention.

FIGS. 2 and 3 schematically illustrate a plan view and a cross sectional view of the memory cells 10 respectively in the memory cell array 20 shown in FIG. 1. It is noted that the X, Y, and Z directions shown in FIGS. 2 and 3 are provided for ease of the explanation and equivalent to the row direction, the column direction, and the direction perpendicular to the semiconductor substrate of the device. The cross sectional view of FIG. 3 is taken along the YZ plane. As shown in FIGS. 2 and 3, at least a part of the p-type semiconductor substrate 30 (or a p-type well) is an active region separated by an element separating layer 31 such as an STI (shallow trench isolation) technique, a gate insulating layer 32 is formed at least partly on the active region, a gate electrode 33 of polycrystalline silicon is formed on the gate insulating layer 32 so as to cover at least a part of the gate insulating layer 32, a channel region 34 is formed beneath the gate insulating layer 32, and impurity diffused regions 35 and 36 are formed at both sides of the channel region 34 to act as the source and the drain respectively and arranged of which the conductivity (n type) is opposite to that of the semiconductor substrate 30, thus constituting a select transistor 12. The gate electrodes 33 of the select transistors 12 in two adjacent memory cells along the row (in the X direction) are connected to each other, thus constituting a word line WL (WL1 to WLm).

The impurity diffused (source) region 35 is connected to a source line SL extending along the row (in the X direction) by a contact hole 37 provided in an interlayer insulating layer above the impurity diffused region 35 and filled with an electrically conductive material. The other impurity diffused (drain) region 36 is connected to a lower electrode 13 of the variable resistance element 11 by a contact hole 38 which is equal to the contact hole 37. An upper electrode 15 of the variable resistance element 11 extends along the column (in the Y direction) to act as a bit line BL (BL1 to BLn). In the plan view of FIG. 2, the source line SL extending along the row (in the X direction) and the bit line BL (BL1 to BLn) extending along the column (in the Y direction) are not illustrated for exposing the lower structure.

The variable resistance element 11 is arranged commonly of a three-layer structure which comprises the lower electrode 13, a variable resistor 14, and the upper electrode 15 layered in this order. As previously described, as long as the variable resistance element 11 is designed for shifting the resistance level from the first state to the second state when receiving the first write voltage between the two ports and shifting the resistance level from the second state to the first state when receiving the second write voltage between the two ports which is opposite in the polarity to and greater in the absolute value than the first voltage, the shape of the variable resistance element 11 and the material of its variable resistor 14 may be determined as desired. Preferably, the material of the variable resistor 14 is selected from oxide materials of a perovskite structure containing manganese, for example, materials represented by $Pr_{(1-x)}Ca_xMnO_3$, $La_{(1-x)}Ca_xMnO_3$, $La_{(1-x-y)}Ca_xPb_yMnO_3$ (where x<1, y<1, and x+y<1), $Sr_2FeMoO_6$, and $Sr_2FeWO_6$, or more specifically manganese oxide films such as $Pr_{0.7}Ca_{0.3}MnO_3$, $La_{0.65}Ca_{0.35}MnO_3$, and $La_{0.65}Ca_{0.175}Pb_{0.175}MnO_3$, and furthermore, other materials containing oxides or nitrides of an element selected from titanium, nickel, vanadium, zirconium, tungsten, cobalt, zinc, iron, or copper. Alternatively, the variable resistor 14 may be constructed by a manganese contained oxide material, a metal oxide material, or a metal nitride material of a perovskite structure sandwiched from upper and lower by electrically conductive oxide layers, nitride layers, or oxide-nitride layers containing aluminum, copper, titanium, nickel, vanadium, zirconium, tungsten, cobalt, zinc, or iron, or metal containing them. The shape and material are of no limitations as long as the electric resistance level is favorably changed or turned to a desired level or more particularly shifted from the first state to the second state upon application of the first write voltage and from the second state to the first state upon application of the second write voltage. The above described materials are preferable for ensuring the properties of enhancement.

Figure 4:
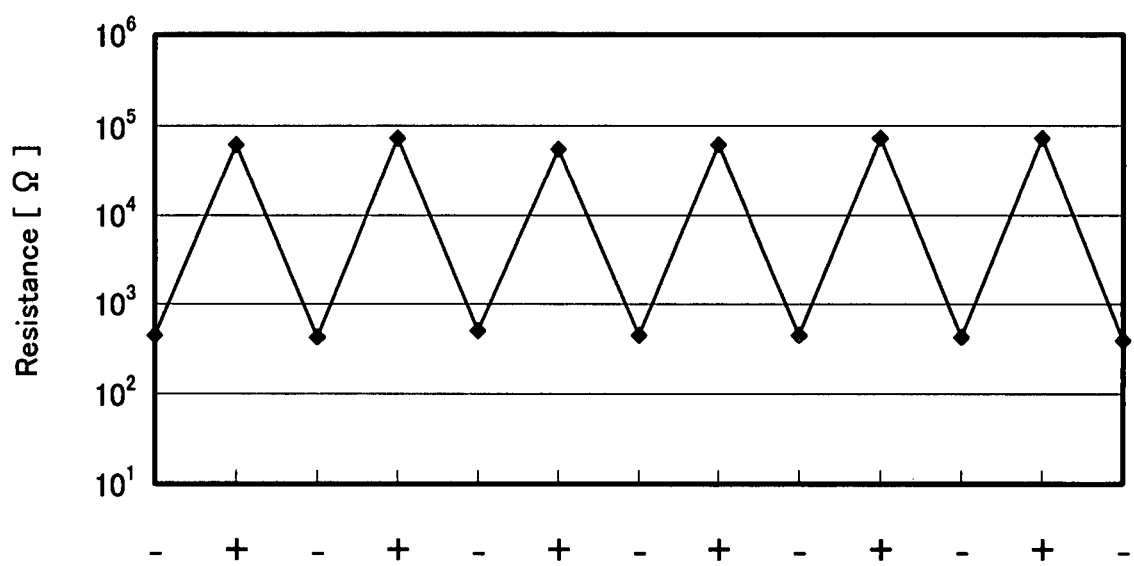
FIG. 4 is a profile of the writing characteristic of a variable resistance element in the semiconductor memory device according to the first embodiment of the present invention.

FIG. 4 illustrates a profile of the switching action (writing property) with application of a voltage of the variable resistor 14 made of an oxide-nitride material containing titanium in the variable resistance element 11. As shown in FIG. 4, when receiving the first write voltage of a positive value (denoted by +) at its lower electrode with reference to the upper electrode, the variable resistance element 11 shifts its resistance level from the low level (the first state) to the high level (the second state) (the first writing action). In reverse, when receiving the second write voltage of a negative value (denoted by −) at its lower electrode with reference to the upper electrode, the variable resistance element 11 shifts its resistance level from the high level (the second state) to the low level (the first state) (the second writing action). As the polarity of the write voltage applied to the variable resistance element 11 between the two ports is changed alternately, the resistance level of the variable resistance element 11 switches between the low level and the high level. The shift of the resistance level is translated to a binary data (0 or 1) which is saved as a piece of information in the variable resistance element 11 and can thus be written.

In the memory cell shown in FIGS. 2 and 3, while the upper electrode is supplied with a reference potential received from the bit line BL during the first write action, the lower electrode is supplied with the first write voltage of a positive value with reference to the upper electrode received via the select transistor 12 from the source line SL. Accordingly, the first write voltage applied to the lower electrode with reference to the upper electrode is equal to a difference between the gate voltage and the threshold voltage in the select transistor 12, thus allowing the variable resistance element 11 to receive no actual level of the voltage applied between the bit line BL and the source line SL. On the other hand, while the upper electrode is supplied with the reference potential received from the bit line BL during the second write action, the lower electrode is supplied with the second write voltage of a negative value with reference to the upper electrode received via the select transistor 12 from the source line SL. However, the second write voltage applied to the lower electrode with reference to the upper electrode is not equal to a difference between the gate voltage and the threshold voltage in the select transistor 12, thus allowing the variable resistance element 11 to receive an actual level of the voltage applied between the bit line BL and the source line SL. Since the variable resistance element 11 is contemplated to have a writing voltage attribute characteristic where the absolute value of the first write voltage is lower than the absolute value of the second write voltage, the voltage applied between the bit line BL and the source line SL (equivalent to the first or second voltage) for conducting the first writing action or the second writing action can be decreased in the level and provided for common use. More specifically, since a drop in the voltage by the threshold during the first writing action needs not to be compensated, the voltage can be used at a lower level.

As apparent from FIG. 4, the writing voltage profile of the memory cell shown in FIGS. 2 and 3 is asymmetrical where the first writing voltage at the positive value expressed by + is lower in the absolute value than the second writing voltage at the negative value expressed by −1

The writing action and the reading action will now be described at each memory cell of the inventive device shown in FIGS. 2 and 3.

Figure 5:
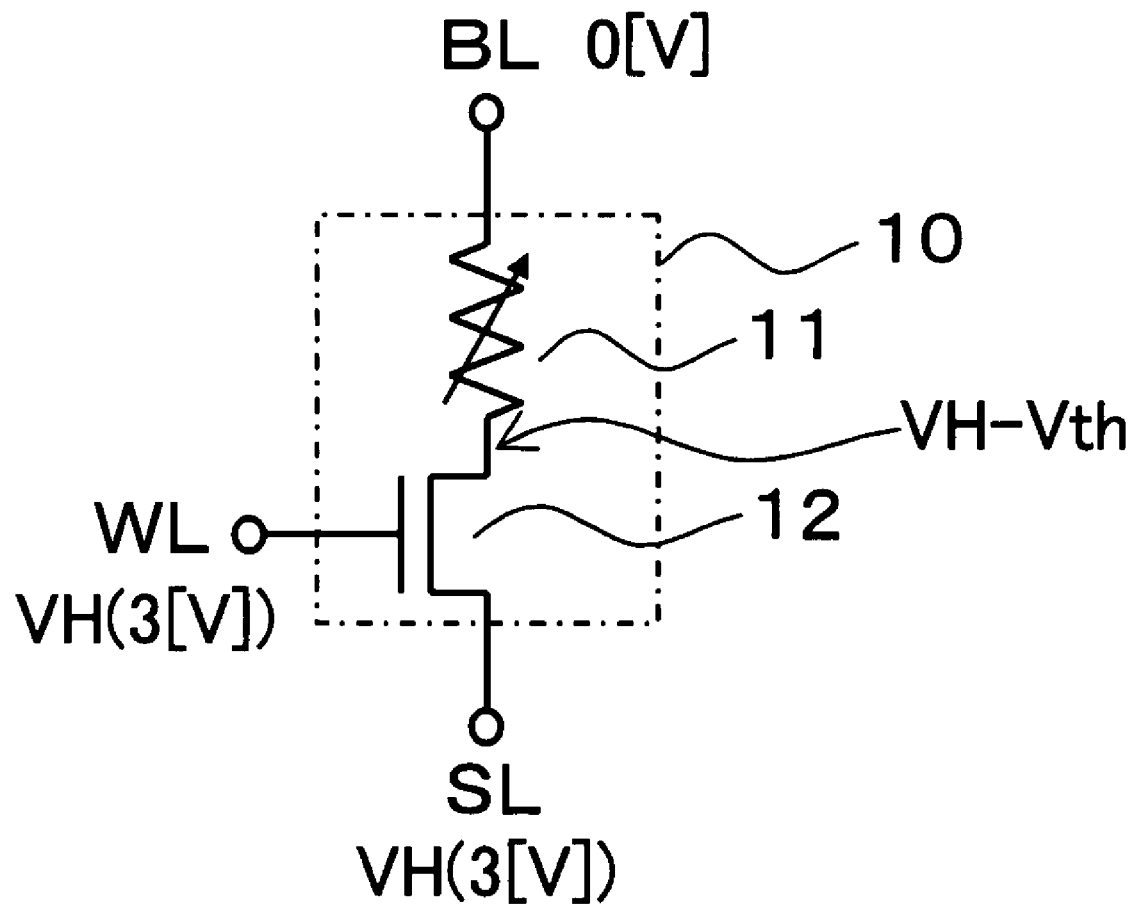
FIG. 5 is a view showing the voltage applying condition for subjecting each memory cell in the semiconductor memory device to the programming action (the first writing action) according to the first embodiment of the present invention.

FIG. 5 illustrates the first writing action on the memory cell of the arrangement shown in FIGS. 2 and 3 (referred to as programming action hereinafter) with the voltage applying conditions at the primary parts. The programming action starts with the memory cell 10 having the bit line BL supplied with 0 V (of the grounding voltage), the source line SL supplied with a voltage VH at +3 V for example, and the word line WL supplied with the voltage VH at +3 V which is higher than the threshold voltage Vth of the select transistor 12. At the time, the variable resistance element 11 is supplied at the select transistor 12 side (the lower electrode side of the variable resistance element 11) with a difference (VH−Vth), +2.1 V for example, between the gate voltage VH (+3 V) and the threshold voltage Vth of the select transistor 12. Accordingly, the positive voltage (VH−Vth) with reference to upper electrode, for example +2.1 V is applied to between the two ports of the variable resistance element 11. This allows the current path to be developed extending from the source line SL to the bit line BL, thus shifting the resistance state of the variable resistance element 11 from the low level (the first state) to the high level (the second state). Accordingly, the programming action of the memory cell 10 can be carried out using the difference voltage (VH−Vth) between the two ports of the variable resistance element 11 which is as low as +2.1 V (acting as the first write voltage).

The voltage at 0 V applied to the bit line BL may be varied within a range from +1 V to −1 V. However, as the first write voltage is effected by the variation, the voltage applied to the word line WL has to be modified in the same way to hold the first write voltage at a constant level. Therefore, the voltage applied to the bit line BL is preferably 0 V. This allows the bit line BL to be supplied with 0 V of the grounding voltage which is common to the peripheral circuit in the inventive device.

The voltage VH (+3 V for example) to be applied to the source line SL may be varied by the threshold voltage Vth of the select transistor 12. Since the voltage VH is commonly used for applying to the word line WL during the programming action, the inventive device can be decreased in the overall chip size through simplifying the its peripheral circuit. Moreover, when the voltage VH is equal to the level of a source voltage, a boosting circuit for boosting the voltage VH will hardly be needed.

Figure 6:
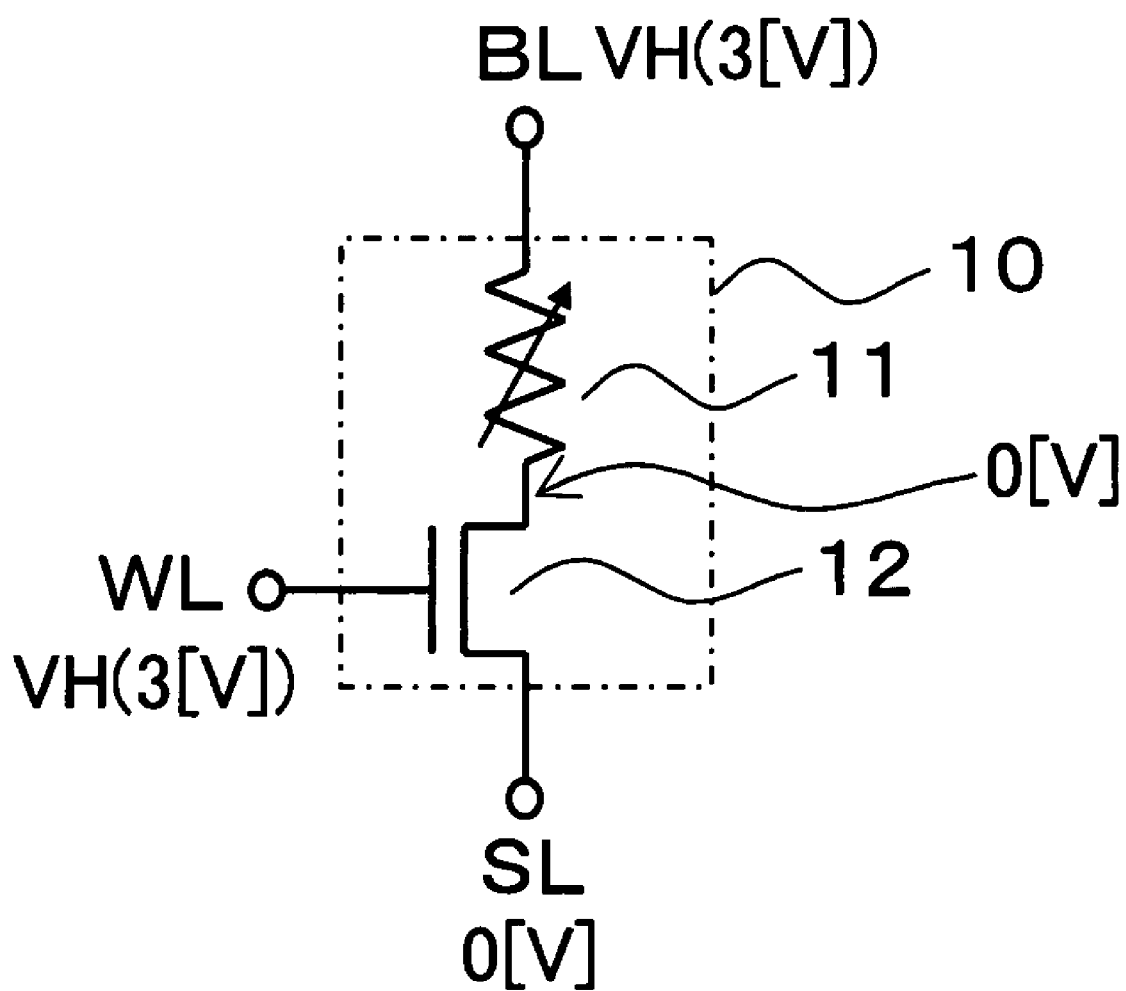
FIG. 6 is a view showing the voltage applying condition for subjecting each memory cell in the semiconductor memory device to the erasing action (the second writing action) according to the first embodiment of the present invention.

FIG. 6 illustrates the second writing action on the memory cell of the arrangement shown in FIGS. 2 and 3 (referred to an erasing action hereinafter) with the voltage applying conditions at the primary parts. The erasing action starts with the memory cell 10 having the source line SL supplied with 0 V (of the grounding voltage), the bit line BL supplied with a voltage VH at +3 V for example, and the word line WL supplied with the voltage VH at +3 V which is higher than the threshold voltage Vth of the select transistor 12. At the time, since the select transistor 12 is an n-channel MOSFET, and the drain of the select transistor 12 remains supplied (at the lower electrode side of the variable resistance element 11) with 0 V which is equal to the voltage applied to the source line SL, the variable resistance element 11 is supplied between the two ports with a negative voltage −VH (−3 V) with reference to the upper electrode. This allows the current path to be developed extending from the bit line BL to the source line SL, thus shifting the resistance state of the variable resistance element 11 from the high level (the second state) to the low level (the first state). Accordingly, the erasing action of the memory cell 10 can be carried out using the (second write) voltage at 3 V applied to between the two ports of the variable resistance element 11 which is higher in the absolute value than that of the programming action.

The voltage at 0 V applied to the source line SL may be varied within a range from +1 V to −1 V. However, as the second write voltage is effected by the variation, the voltage applied to the bit line BL has to be modified in the same way to hold the second write voltage at a constant level. Therefore, the voltage applied to the source line SL is preferably 0 V. This allows the source line SL to be supplied with 0 V of the grounding voltage which is common to the peripheral circuit in the inventive device.

Similarly, the voltage VH (+3 V for example) to be applied to the bit line BL may be modified by +1 V or −1 V. For remaining constant as the second write voltage, the voltage applied to the bit line BL is preferably at VH. Hence, the voltage VH is commonly used for applying to the word line WL during the erasing action, the inventive device can be decreased in the overall chip size through simplifying the its peripheral circuit. Moreover, when the voltage VH is equal to the level of a source voltage, a boosting circuit for boosting the voltage VH will hardly be needed.

Furthermore, since the voltage VH to be applied to both the source line SL and the word line WL for the programming action is equal to the voltage VH to be applied to both the bit line BL and the word line WL for the erasing action, the programming action and the erasing action can share the voltage VH, thus allowing the inventive device to be decreased in the overall chip size through simplifying the its peripheral circuit which includes a voltage generator circuit.

The absolute of the second write voltage to be applied to the variable resistance element between the two ports for the erasing action is determined by the voltage VH applied to the bit line BL. While the voltage VH is set depending on the second write voltage, the first write voltage (VH−Vth) applied to between the two ports of the variable resistance element for the programming action is determined by the threshold voltage Vth of the select transistor. Accordingly, the asymmetry of both the first and second write voltages can be controlled with the threshold voltage Vth of the select transistor. This permits the voltage to be applied to both the source line SL and the word line WL for the programming action and the voltage to be applied to both the bit line BL and the word line WL for the erasing action to be compatible to each other.

Figure 7:
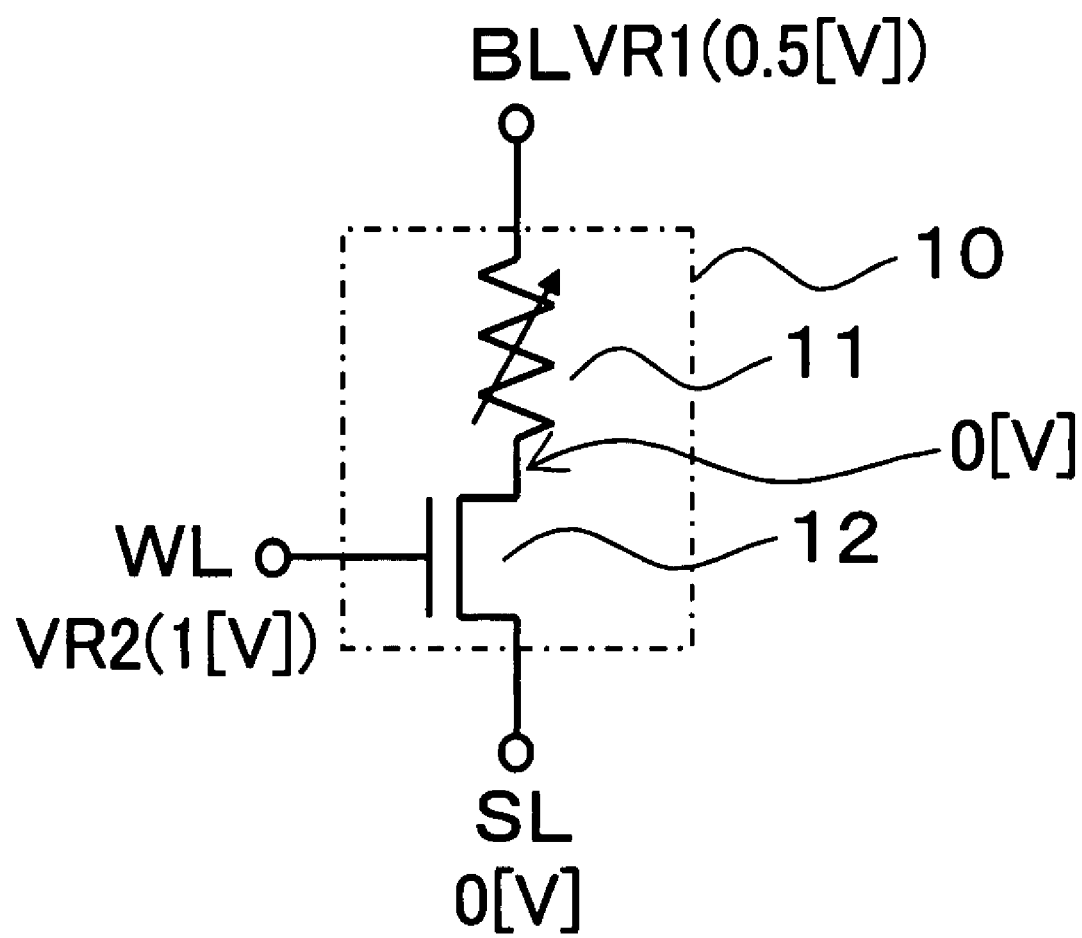
FIG. 7 is a view showing the voltage applying condition for subjecting each memory cell in the semiconductor memory device to the reading action according to the first embodiment of the present invention.

FIG. 7 illustrates the reading action on the memory cell of the arrangement shown in FIGS. 2 and 3 with the voltage applying condition at the primary parts. The reading action starts with the memory cell 10 having the source line SL supplied with 0 V (of the grounding voltage), the bit line BL supplied with a readout voltage VR1 (a third voltage) at +0.5 V for example, and the word line WL supplied with a voltage VR2 at +1.0 V which is higher than the threshold voltage Vth of the select transistor 12. At the time, the select transistor 12 of an n-channel MSOFET is turned on and the variable resistance element 11 is supplied at the lower electrode with 0 V (of the grounding voltage) equal to that applied to the source line SL through the select transistor 12 and at the upper electrode with the readout voltage VR1 (0.5 V for example) through the bit line BL. This allows the readout current to run from the upper electrode to the lower electrode corresponding to the resistance state of the variable resistance element and from the bit line BL to the source line SL. Accordingly, the resistance state of the variable resistance element or the information stored in the memory cell can be read out through measuring the readout current.

The polarity of the readout voltage VR1 to be applied to the variable resistance element between the two ports is negative with reference to the upper electrode and equal to the second write voltage (−VH) applied to the variable resistance element between the two ports during the erasing action. A difference (VH−VR1) between (the absolute values of) the two voltages is hence 2.5 V (=3V−0.5V). If the readout voltage VR1 is positive with reference to the upper electrode and different from that of this embodiment, it is equal in the polarity to the first write voltage (VH−Vth) applied to the variable resistance element between the two ports during the programming action. Accordingly, a difference (VH−Vth−VR1) (of the absolute value) between the first write voltage and the readout voltage is as low as 1.6 V (=2.1V−0.5V), thus increasing the possibility of the loss of stored information during the reading action. This embodiment permits the readout voltage to be supplied at the same polarity as of the write voltage (for the erasing action in this case) which is greater in the absolute value than the other, whereby the possibility of the loss of stored information will be decreased.

Figure 8:
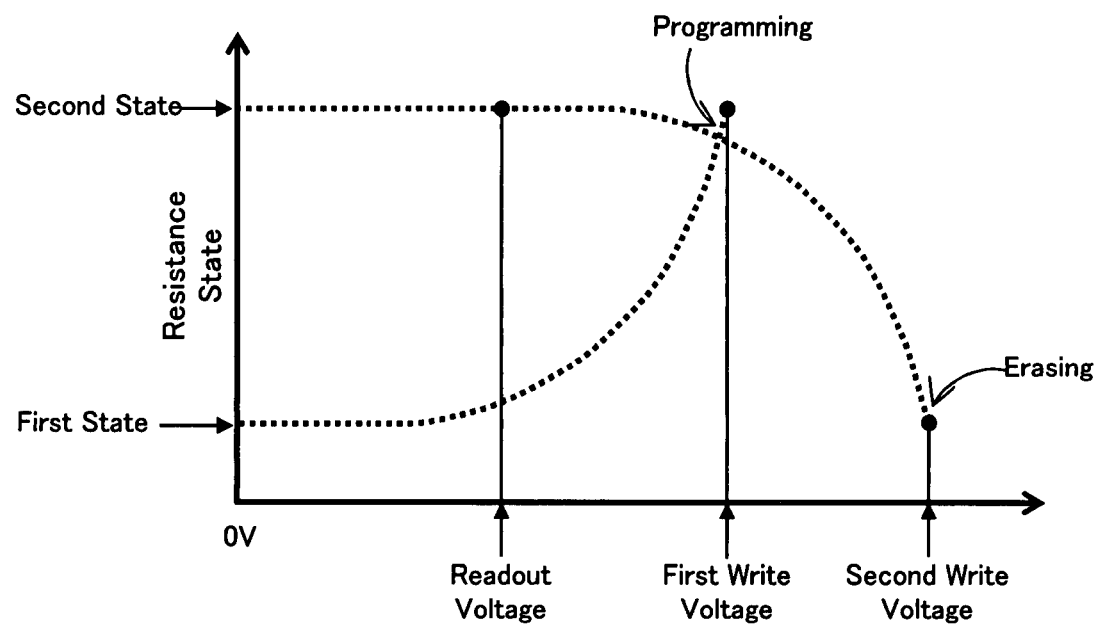
FIG. 8 is a profile showing the relationship between the resistance level in the variable resistance element and (the absolute value of) the voltage applied to the variable resistance element between the two ports for the writing action, the erasing action, and the reading action in the semiconductor memory device according to the first embodiment of the present invention.

FIG. 8 illustrates a profile of the relationship between the resistance state of the variable resistance element and (the absolute value of) the voltage which is applied to between the two ports of the variable resistance element during the programming, erasing, and reading actions. As shown in FIG. 8, when the first write voltage (VH−Vth) at the positive polarity with reference to the upper electrode is applied to between the two ports, the variable resistance element shifts its resistance state from the low level (the first state) to the high level (the second state) for carrying out the programming action. Also, when the second write voltage (−VH) at the negative polarity with reference to the upper electrode, which is greater in the absolute value than the first write voltage, is applied to between the two ports, the variable resistance element shifts its resistance state from the high level (the second state) to the low level (the first state) for carrying out the erasing action.

Since the readout voltage (−VR1) to be applied to the variable resistance element between the two ports during the reading action is equal in the polarity to the second write voltage (−VH) applied to between the two ports of the variable resistance element for conducting the erasing action, it may cause the resistance state of the variable resistance element to shift from the high level (the second state) to the low level (the first state) for carrying out the reading action. Accordingly, when a difference between the readout voltage and the second write voltage (−VH) is made sufficiently, a change in the resistance level can be minimized. Meanwhile, as the readout voltage (−VR1) to be applied to the variable resistance element between the two ports during the reading action is opposite in the polarity to the first write voltage (VH−Vth) applied to between the two ports of the variable resistance element for conducting the programming action, it disallows the resistance state of the variable resistance element to shift from the low level (the first state) to the high level (the second state).

Figure 9:
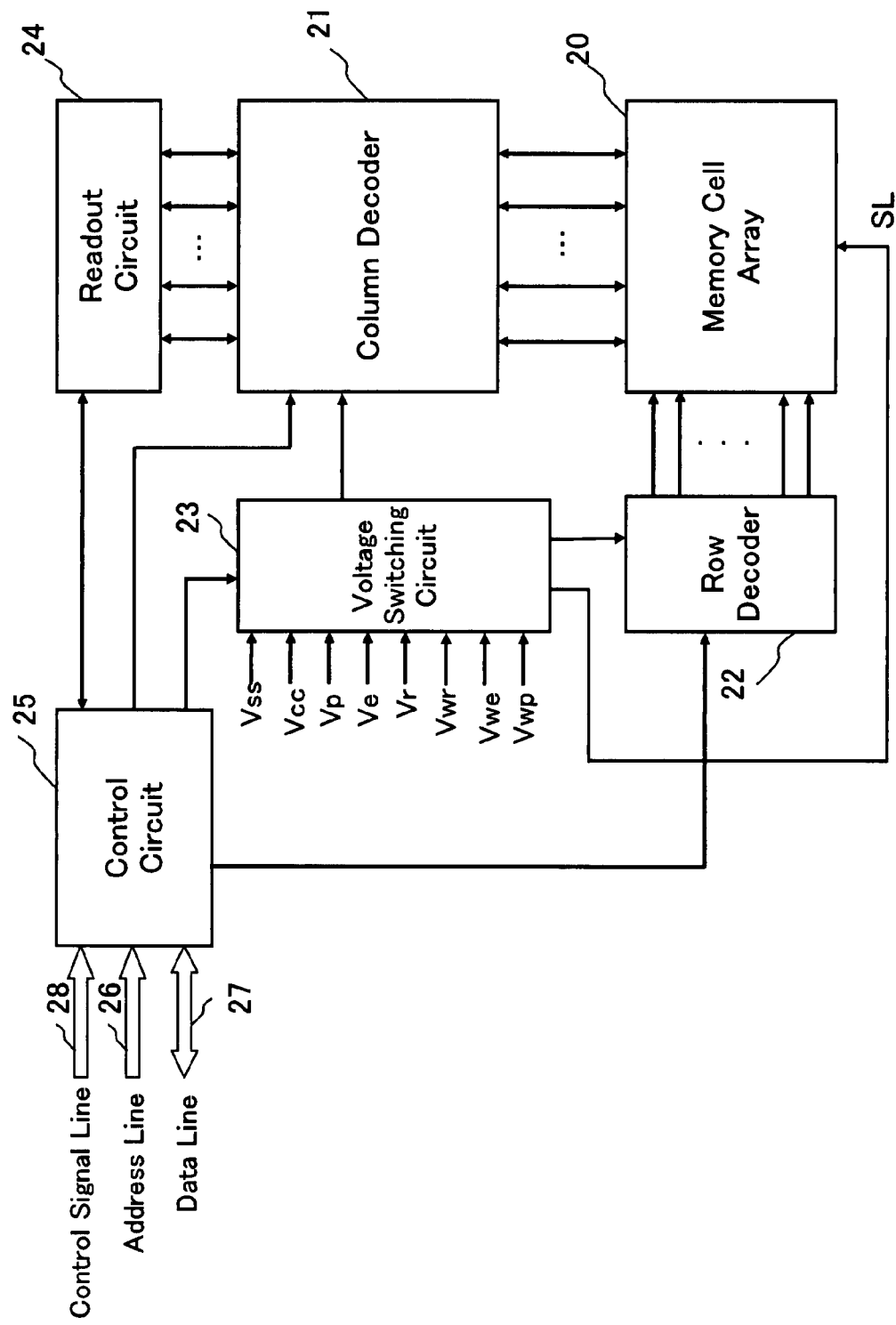
FIG. 9 is a block diagram schematically showing a circuitry arrangement of the semiconductor device according to the first embodiment of the present invention.

The voltage applying condition at the word lines WL1 to WLm, the bit lines BL1 to BLn, and the source lines SL in the memory cell array 20 shown in FIG. 1 during the writing action (the programming action and the erasing action) and the reading action at the memory cell basis will be described. The description starts with the peripheral circuit designed for applying the predetermined voltage to each of the word lines WL1 to WLm, each of the bit lines BL1 to BLn, and each of the source lines SL. FIG. 9 schematically illustrates an exemplary arrangement of the peripheral circuit in the inventive device.

As shown in FIG. 9, the memory cell array 20 of the inventive device shown in FIG. 1 is accompanied with a column decoder 21, a row decoder 22, a voltage switching circuit 23, a readout circuit 24, and a control circuit 25.

The column decoder 21 and the row decoder 22 are arranged for, in response to an address input supplied from an address line 26 and received by the control circuit 25, selecting from the memory cell array 20 the memory cell of interest to be subjected to the reading action, the programming action (the first writing action), and the erasing action (the second writing action). For generally conducting the reading action, the row decoder 22 selects the word line in the memory cell array 20 in response to the input signal received from the address line 26 while the column decoder 21 selects the bit line in the memory cell array 20 in response to the address signal received by the address line 26. For starting the programming action, the erasing action, and their related verifying action (the reading action for verifying the resistance state in the memory cell after the programming action and the erasing action), the row decoder 22 selects one or more of the word lines in the memory cell array 20 in response to a row address signal determined by the control circuit 25 while the column decoder 21 selects one or more of the bit lines in the memory cell array 20 in response to a column address signal determined by the control circuit 25. The memory cell of interest connected with the selected word line determined by the row decoder 22 and the selected bit line determined by the column decoder 21 is then designated as a selected memory cell. More specifically, the gate of the select transistor in the memory cell of interest to be subjected to the desired action is connected to the selected word line while the selected memory cell is connected at one end (namely, the upper electrode of the variable resistance element in this embodiment) to the selected bit line.

The control circuit 25 is arranged for controlling the programming action, the erasing action (including a batch erasing action), and the reading action. In response to the address signal from the address line 26, the data input from a data line 27 (during the programming action), and the control signal from a control signal line 28, the control circuit 25 controls the action of the row decoder 22, the column decoder 21, the voltage switching circuit 23, and the memory cell array 20 for carrying out the reading action, the programming action, or the erasing action. In the arrangement shown in FIG. 6, the control circuit 25 includes an address buffer circuit, a data input/output buffer circuit, and a control input buffer circuit which are commonly provided as not shown.

The voltage switching circuit 23 is arranged for switching the voltages at the (selected and unselected) word lines, the (selected and unselected) bit lines, and the source lines according to the action mode for the reading action, the programming action, or the erasing action and supplying the same to the memory cell array 20. More particularly, the voltage to be applied to the selected word line and unselected word lines is supplied from the voltage switching circuit 23 via the row decoder 22 to the word lines, the voltage to be applied to the selected bit line and unselected bit lines is supplied from the voltage switching circuit 23 via the column decoder 21 to the bit lines, and the voltage to be applied to the source line is supplied from the voltage switching circuit 23 directly to the source lines. In FIG. 6, Vcc is the source voltage of the inventive device, Vss is the grounding voltage, Vr is the readout voltage, Vp is the supply voltage for the programming action (the absolute value of the first write voltage applied between the two ports of the selected memory cell), Ve is the supply voltage for the erasing action (the absolute value of the second write voltage applied between the two ports of the selected memory cell), Vwr is the selected word line voltage for the reading action, Vwp is the selected word line voltage for the programming action, and Vwe is the selected word line voltage for the erasing action. As described previously, the supply voltage Vp for the programming action, the supply voltage Ve for the erasing action, the selected word line voltage Vwp for the programming action, and the selected word line voltage Vwe for the erasing action are equal to the voltage VH and can thus be used commonly. Accordingly, the voltage inputs shown in FIG. 9 are common to the voltage switching circuit 23.

The readout circuit 24 is arranged for comparing the readout current flown from the selected bit line determined by the column decoder 21 via the selected memory cell to the source line directly or after conversion to a voltage form with a reference current or a reference voltage in order to judge the state of stored information (the resistance level) before dispatching a result of the judgment to the control circuit 25 and outputting to the data line 27.

Figure 10:
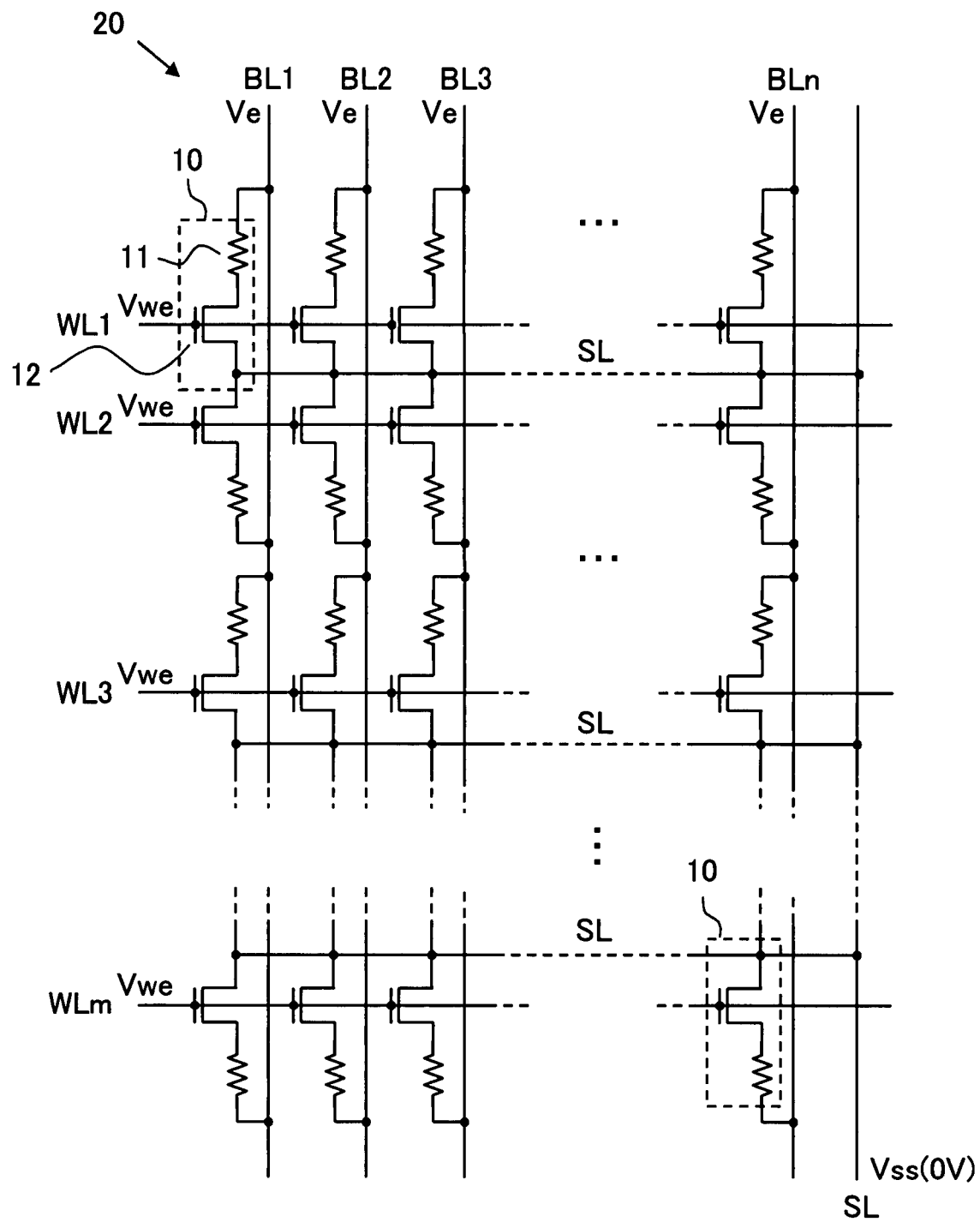
FIG. 10 is a view showing the voltage applying condition for conducting the erasing action (the second writing action) on the semiconductor memory device according to the first embodiment of the present invention.

The voltage applying condition for subjecting the memory cell array 20 to a batch erasing action will now be described. The action for erasing the memory cell array 20 at once starts with the row decoder 22 selecting all the word lines WL1 to WLm as selected word lines and applying the selected word line voltage Vwe (=VH, 3 V for example) thereto, as shown in FIG. 10. Simultaneously, the column decoder 21 selects all the bit lines BL1 to BLn as selected bit lines and applies the erase voltage Ve (=VH, 3 V for example) thereto. Also, the source lines SL are supplied with 0 V (of the grounding voltage Vss). Accordingly, all the select transistors in the memory cells are turned on, allowing the lower electrodes of the corresponding variable resistance elements to receive 0 V from the source lines SL and at the same time, the upper electrodes to receive the erase voltage Ve (=VH, 3 V for example) from the bit lines BL1 to BLn. The variable resistance elements are hence supplied with the negative voltage (−Ve) at their lower electrodes with reference to the upper electrodes, thus subjecting all the memory cells in the memory cell array at once to the erasing action similar to that for each memory cell shown in FIG. 6 and shifting the resistance state of each variable resistance element from the second state (the high level) to the first state (the low level). The pulse width of pulses of the erase voltage Ve (a duration of the voltage application for completing the erasing action) is determined by an overlapping period between the duration of application of the selected word line voltage Vwe applied to the word lines WL1 to WLm and the duration of application of the erase voltage Ve applied to the bit lines BL1 to BLn. In other words, the application of the selected word line voltage Vwe and the application of the erase voltage Ve may be carried out with either starting earlier or ending later.

When a group of the memory cells in the memory cell array 20, for example, along one or more rows are subjected to the batch erasing action, corresponding one or more of the word lines connected to the memory cells to be erased are selected and supplied with the selected word line voltage Vwe while the other unselected word lines remain supplied with 0 V (of the grounding voltage Vss). Accordingly, the select transistors of the selected memory cells connected to the selected word lines are turned on, thus allowing the lower electrodes of their corresponding variable resistance elements to receive the negative voltage (−Ve) with reference to the upper electrodes. As the result, a desired group of the memory cells along one or more of the rows in the memory cell array 20 can be subjected at once to the erasing action. Alternatively, the row decoder 22 may be modified to have an additional function for selecting a desired number of the word lines, if desired so.

Also, when another group of the memory cells in the memory cell array 20, for example, along one or more columns are subjected to the batch erasing action, corresponding one or more of the bit lines connected to the memory cells to be erased are selected and supplied with the erase voltage Ve while the other unselected bit lines remain supplied with 0 V (of the grounding voltage Vss) or at the floating state (under high impedance). This allows the lower electrodes of their corresponding variable resistance elements in the selected memory cells connected to the selected bit lines to receive the negative voltage (−Ve) with reference to the upper electrodes. As the result, a desired group of the memory cells along one or more of the columns in the memory cell array 20 can be subjected at once to the erasing action. Alternatively, the column decoder 21 may be modified to have an additional function for selecting a desired number of the bit lines, if desired so.

Moreover, when a further group of the memory cells in the memory cell array 20, for example, along one or more rows and columns are subjected to the batch erasing action, corresponding one or more of the word lines connected to the memory cells of interest along the desired row or rows are selected and supplied with the selected word line voltage Vwe while the other unselected word lines remain supplied with 0 V (of the grounding voltage Vss). At the same time, corresponding one or more of the bit lines connected to the memory cells of interest along the desired column or columns are selected and supplied with the erase voltage Ve while the other unselected bit lines remain supplied with 0 V (of the grounding voltage Vss) or at the floating state. This allows the lower electrodes of their corresponding variable resistance elements in the selected memory cells to be erased to receive the negative voltage (−Ve) with reference to the upper electrodes. As the result, a desired group of the memory cells determined by the combination of one or more rows and columns in the memory cell array 20 can be subjected at once to the erasing action.

Figure 11:
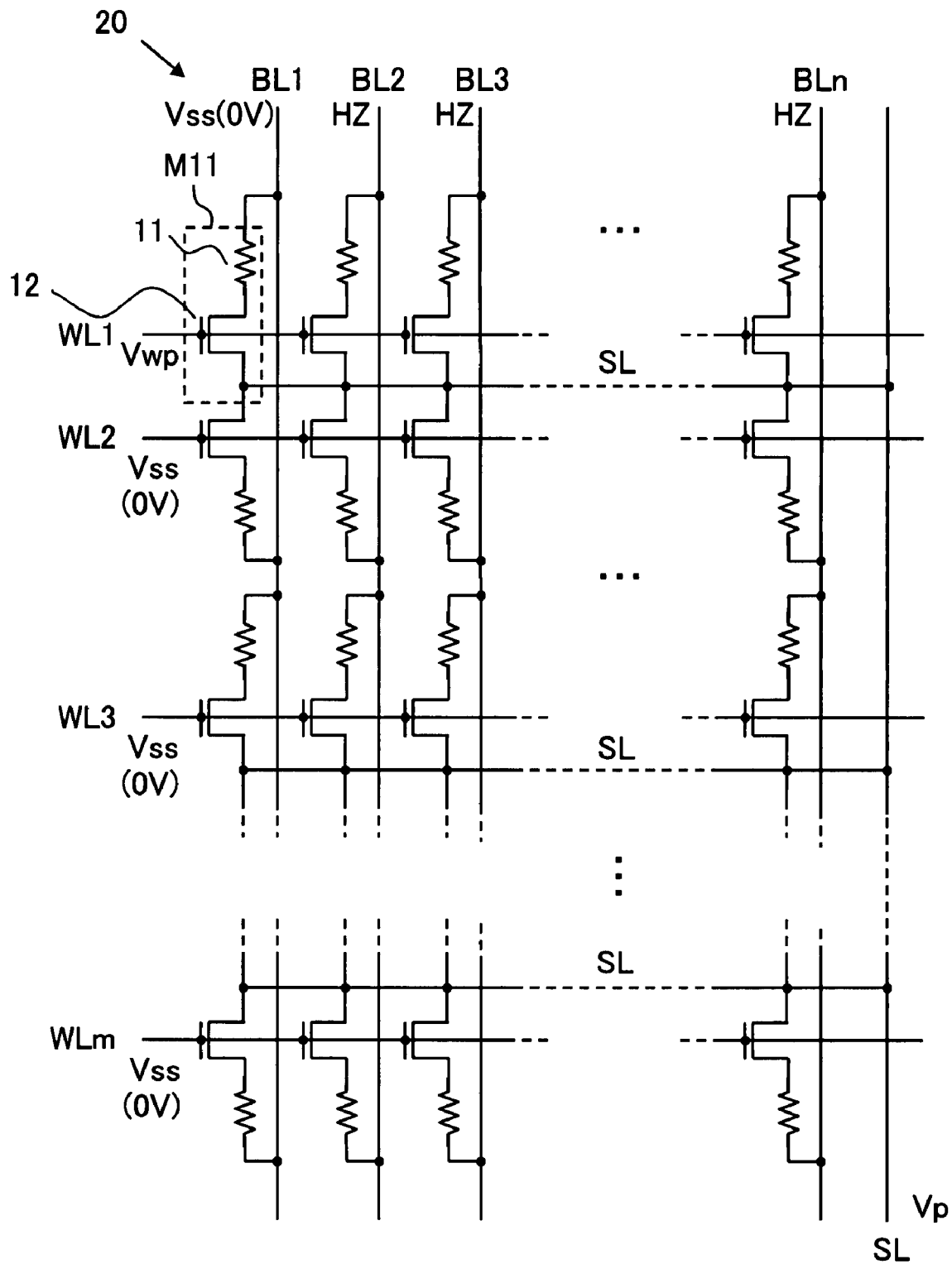
FIG. 11 is a view showing the voltage applying condition for conducting the programming action (the first writing action) on the semiconductor memory device according to the first embodiment of the present invention.

The voltage applying condition for conducting the programming action (first writing action) on each memory cell in the memory cell array 20 will now be described. Assuming that the memory cell denoted by M11 connected to the word line WL1 and the bit line BL1 is the target of the programming action as shown in FIG. 11, the row decoder 22 selects the word line WL1 as a selected word line and applies the predetermined selected word line voltage Vwp (=VH, 3 V for example) thereto while the other unselected word lines WL2 to WLm remain supplied with 0 V (of the grounding voltage Vss). Simultaneously, the column decoder 21 selects the bit line BL1 as a selected bit line and applies 0 V (of the grounding voltage Vss) thereto while the other unselected bit lines BL2 to BLn remain at the floating state (under high impedance). Also, the source line SL is supplied with the program voltage Vp (=VH, 3 V for example). Accordingly, the select transistor in the memory cell M11 is turned on and the program voltage Vp applied to the source line SL is applied to the lower electrode of the corresponding variable resistance element through the select transistor up to a difference (Vwp−Vth) between the gate voltage Vwp and the threshold voltage Vth in the select transistor. At the same time, the upper electrode of the same variable resistance element receives 0 V (of the grounding voltage Vss) through the bit line BL1. The variable resistance element in the selected memory cell M11 is hence supplied at the lower electrode with the positive voltage (Vwp−Vth) with reference to the upper electrode, and thus the programming action for each memory cell shown in FIG. 5 is conducted for the selected memory cell M11 and the resistance state of the variable resistance element in the selected memory cell M11 shifts from the first state (the low level) to the second state (the high level).

The pulse width of pulses of the program voltage (a duration of the voltage application for completing the programming action) is determined by an overlapping period between the duration of application of the selected word line voltage Vwp applied to the word line WL1 and the duration of application of the program voltage Vp applied to the source line SL. In other words, the application of the selected word line voltage Vwp and the application of the program voltage Vp may be carried out with either starting earlier or ending later.

Figure 12:
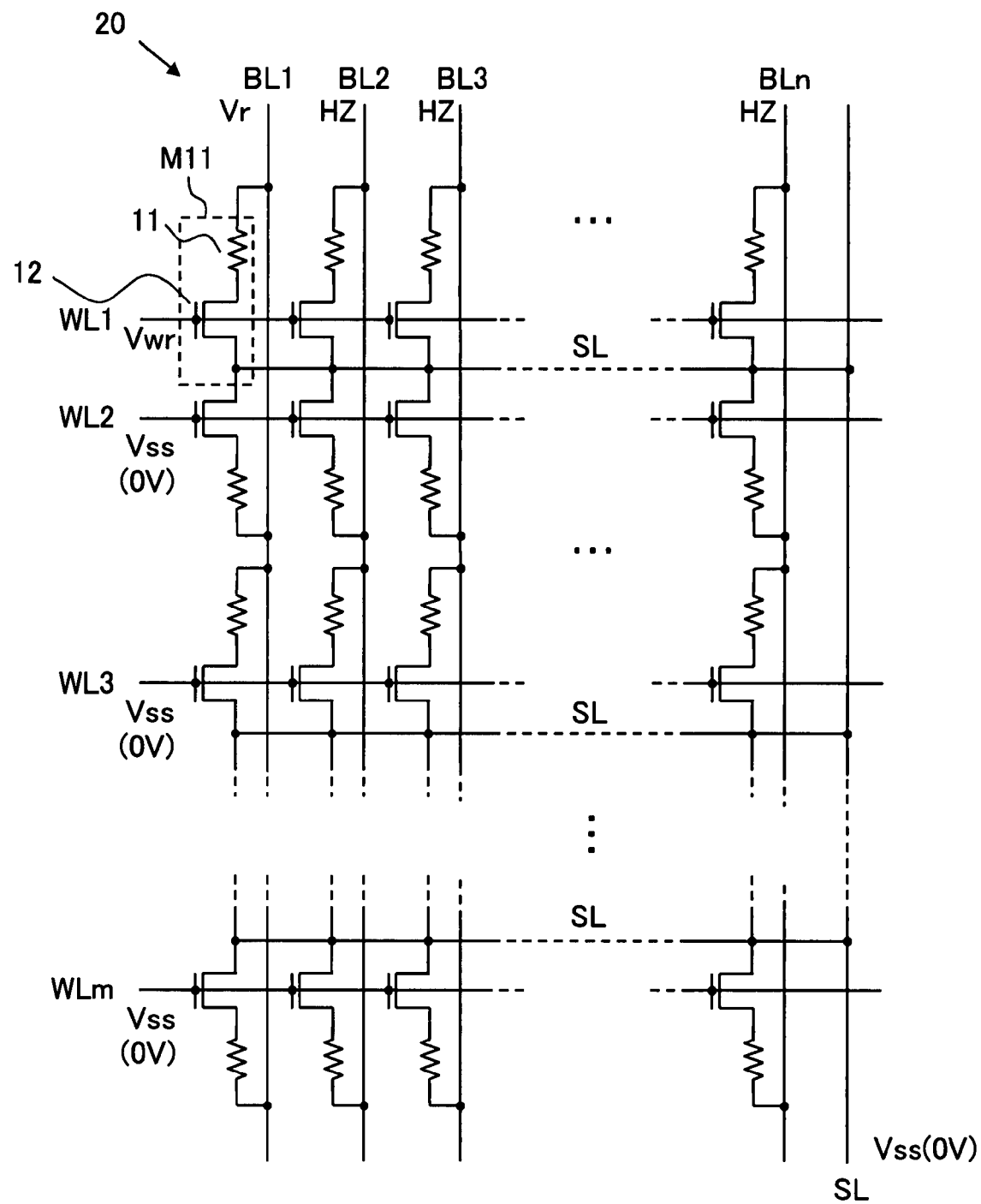
FIG. 12 is a view showing the voltage applying condition for conducting the reading action on the semiconductor memory device according to the first embodiment of the present invention.

The voltage applying condition for conducting the programming action first writing action) on a group of the memory cells in the memory cell array 20 may be satisfied when the memory cells to be subjected at once to the programming action are aligned along one row or column. When the programming action is conducted for a group of the memory cells aligned along one row, for example, the row decoder 22 selects the selected word line and applies the predetermined selected word line voltage Vwp (3 V for example) thereto while the other unselected word lines remain supplied with 0 V (of the grounding voltage Vss), similar to the action of programming each memory cell. Simultaneously, the column decoder 21 selects the corresponding bit lines connected to the memory cells to be subjected to the programming action as selected bit lines and applies 0 V (of the grounding voltage Vss) thereto while the other unselected bit lines remain at the floating state (under high impedance). Also, the source line SL is supplied with the program voltage Vp (3 V for example). This allows the selected memory cells to receive the positive voltage (Vwp−Vth) at the lower electrode with reference to the upper electrode, and thus the selected memory cells are subjected at once to the programming action similar to that for each memory cell shown in FIG. 5 and the resistance state of the variable resistance element in each of the selected memory cells shifts from the first state (the low level) to the second state (the high level). Similarly, when the programming action is conducted for a group of the memory cells aligned along one column, for example, the row decoder 22 selects the corresponding word lines connected to the memory cells to be subjected to the programming action as selected word lines and applies the predetermined selected word line voltage Vwp (3 V for example) thereto while the other unselected word lines remain supplied with 0 V (of the grounding voltage Vss). Simultaneously, the column decoder 21 supplies the selected bit line with 0 V (of the grounding voltage Vss) while the other unselected bit lines remain at the floating state (under high impedance). Also, the source lines SL are supplied with the program voltage Vp (3 V for example). This allows the selected memory cells to receive the positive voltage (Vp−Vth) at the lower electrode with reference to the upper electrode, and thus the first writing action shown in FIG. 5 is conducted for the group of the selected memory cells and the resistance state of the variable resistance element in each of the selected memory cells shifts from the first state (the low level) to the second state (the high level). The voltage applying condition for conducting the reading action on each memory cell in the memory cell array 20 will now be described. Assuming that the memory cell denoted by M11 connected to the word line WL1 and the bit line BL1 is the target of the reading action as shown in FIG. 12, the row decoder 22 selects the word line WL1 as a selected word line and applies the predetermined selected word line voltage Vwr (1.0 V for example) thereto while the other unselected word lines WL2 to WLm remain supplied with 0 V (of the grounding voltage Vss). Simultaneously, the column decoder 21 selects the bit line BL1 as a selected bit line and applies the readout voltage Vr (0.5 V for example) thereto while the other unselected bit lines BL2 to BLn remain at the floating state (under high impedance) or supplied with 0 V (of the grounding voltage Vss). Also, the source line SL is supplied with 0 V (of the grounding voltage Vss). Accordingly, the select transistor in the memory cell M11 is turned on, allowing the corresponding variable resistance element to receive at the lower electrode 0 V (of the grounding voltage Vss) from the source line SL and at the upper electrode the readout voltage Vr (0.5 V for example) from the bit line BL1 at the same time. This allows the readout current to flow from the upper electrode to the lower electrode depending on the resistance state of the variable resistance element in the selected memory cell M11 and more particularly from the selected bit line BL1 to the source line SL. As the result, the data stored in the selected memory cell M11 can be read out by the readout circuit 24 measuring the readout current from the column decoder 21. The voltage applying condition for the reading action may be applied with equal success to the verifying action which is associated with the erasing action and the writing action.

SECOND EMBODIMENT

Figure 13:
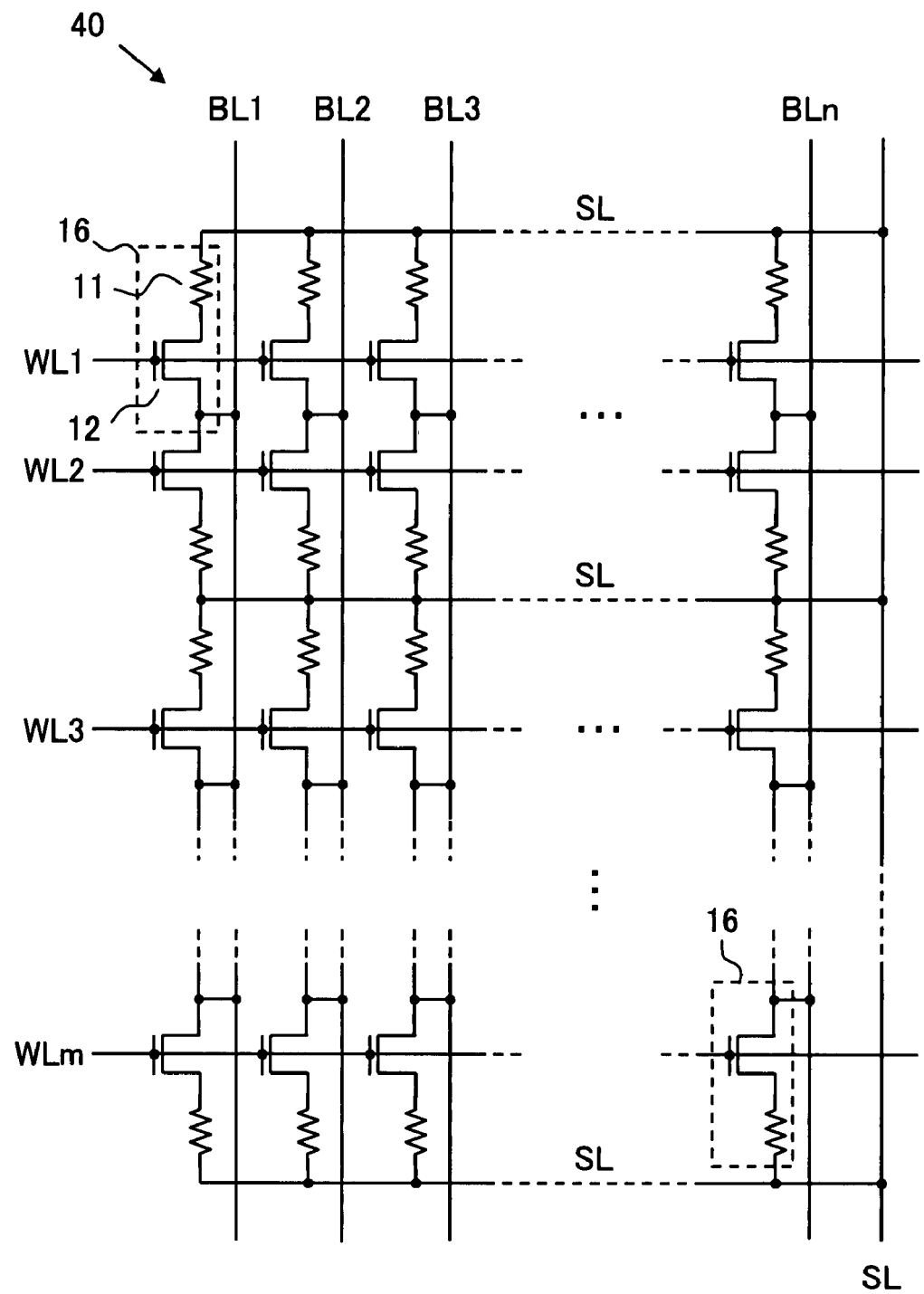
FIG. 13 is a circuitry view schematically showing an arrangement of the memory array in a semiconductor memory device according to the second embodiment of the present invention.

The second embodiment of the present invention will be described. The inventive device of the second embodiment comprises, as shown in FIG. 13, one or more memory cell arrays 40 where a number of memory cells 16 are arranged in rows and columns and groups of words lines WL1 to WLm and bit lines BL1 to BLn arranged to extend along the rows and the columns respectively for selectively driving one or more of the memory cells of interest while a group of source lines SL is arranged to extend along the rows. Although the source lines SL extend along the rows in parallel to the word lines WL1 to WLm, each source line in each row, and are connected commonly at the outside of the memory cell array 40 in the embodiment shown in FIG. 13, they may be modified to one source line SL provided commonly for two adjacent word lines or may extend along the columns but not the rows. Alternatively, each memory cell array 40 may be accompanied with two or more of the source lines SL for selectively driving one or more of the memory cells of interest in cooperation with the word lines and the bit lines.

Moreover, the memory cell array 40 is not limited to the arrangement of FIG. 13 in the form of an equivalent circuit but may be constructed in any combination as long as its memory cell 16 comprising a variable resistance element 11 and a select transistor 12 is connected with the word line, the bit line, and the source line and constitutes a memory cell array. The inventive device is not limited to any particular arrangement of the memory cell array 40.

The memory cell 16 in the inventive device includes a series circuit where the variable resistance element 11 is connected at one end to the source of the select transistor 12. The drain of the select transistor 12 is connected to one of the bit lines BL1 to BLn. The variable resistance element 11 is connected at the other end to the source line SL while the select transistor 12 is connected at the gate to one of the word lines WL1 to WLm. The variable resistance element 11 is a nonvolatile resistance element of a two-port structure which is arranged for, when receiving a first write voltage between its two ports, shifting the resistance level from a first state (for example, the low resistance level) to a second state for example, the high resistance level) and when receiving between the two ports a second write voltage which is opposite in the polarity to and smaller in the absolute value than the first write voltage, shifting from the second state to the first state in order to save a piece of information. The select transistor 12 is an n-channel MOSFET of enhancement type identical to that of the first embodiment.

Figure 14:
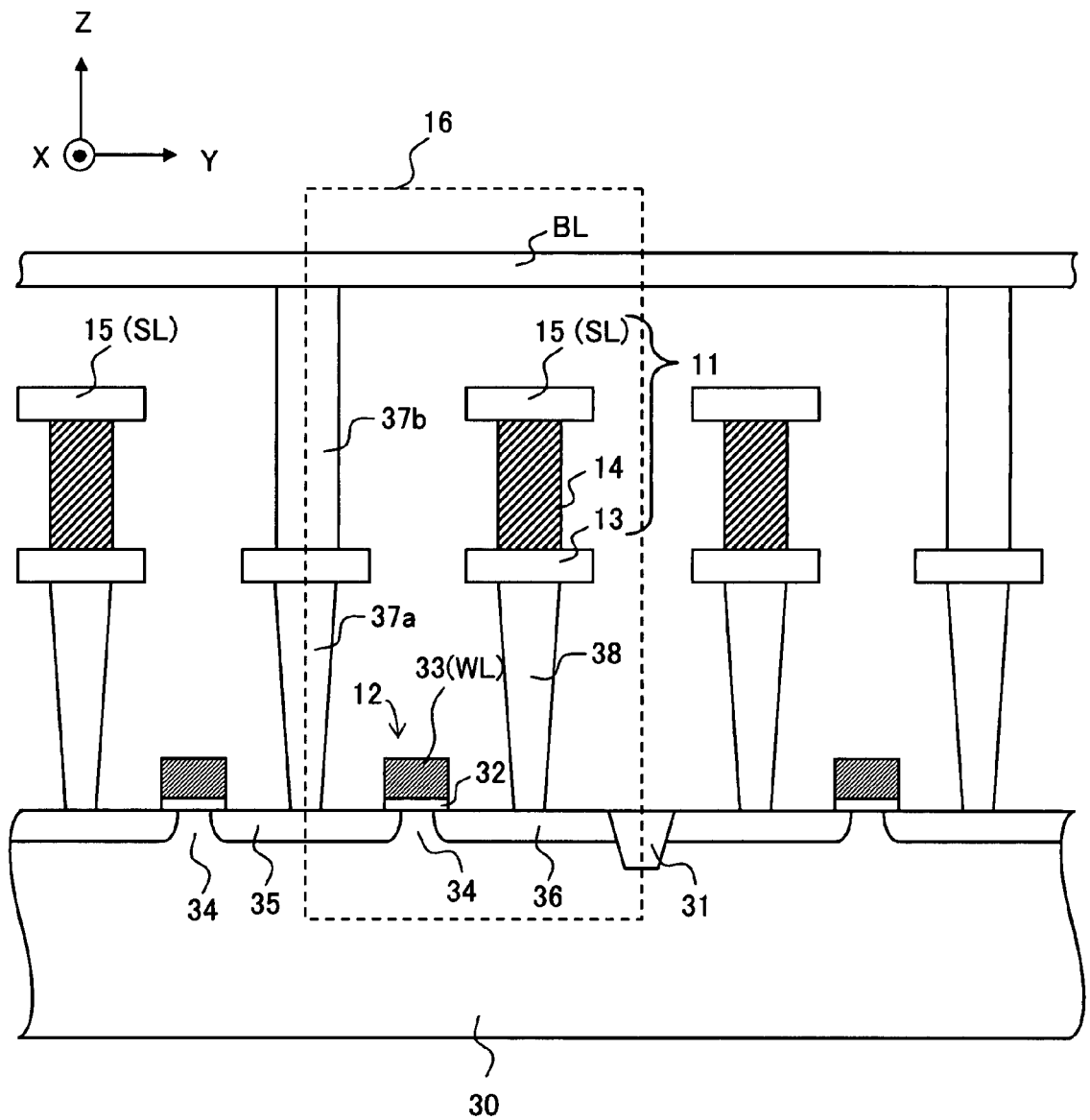
FIG. 14 is a general cross sectional view schematically showing the cross section of the memory cells in the memory array of the semiconductor memory device according to the second embodiment of the present invention.

FIG. 14 schematically illustrates a cross sectional view of the memory cells 16 respectively in the memory cell array 40 shown in FIG. 13. The arrangement at a plan view of the variable resistance element 11 and the select transistor 12 in each of the memory cells 16 in the memory cell array 40 shown in FIG. 13 is identical to that of the first embodiment shown in FIG. 2 excluding its bit lines and word lines. It is noted that the X, Y, and Z directions shown in FIG. 14 are provided for ease of the explanation and equivalent to the row direction, the column direction, and the direction perpendicular to the semiconductor substrate of the device. The cross sectional view of FIG. 14 is taken along the YZ plane. As shown in FIGS. 2 and 14, at least a part of the p-type semiconductor substrate 30 (or a p-type well) is an active region separated by an element separating layer 31 such as an STI (shallow trench isolation) technique, a gate insulating layer 32 is formed at least partly on the active region, a gate electrode 33 of polycrystalline silicon is formed on the gate insulating layer 32 so as to cover at least a part of the gate insulating layer 32, a channel region 34 is formed beneath the gate insulating layer 32, and impurity diffused regions 35 and 36 are formed at both sides of the channel region 34 to act as the source and the drain respectively and arranged of which the conductivity (n type) is opposite to that of the semiconductor substrate 30, thus constituting the select transistor 12. The gate electrodes 33 of the select transistors 12 in two adjacent memory cells along the row (in the X direction) are connected to each other, thus constituting a word line WL (WL1 to WLm).

The impurity diffused (drain) region 35 is connected to a bit line BL (BL1 to BLn) extending along the column (in the Y direction) by a couple of contact holes 37a, 37b provided in an interlayer insulating layer above the impurity diffused region 35 and filled with an electrically conductive material. The other impurity diffused (source) region 36 is connected to a lower electrode 13 of the variable resistance element 11 by a contact hole 38 which is equal to the contact holes 37a, 37b. An upper electrode 15 of the variable resistance element 11 extends along the row (in the X direction) to act as a source line SL. In the plan view of FIG. 2, the source line SL extending along the row (in the X direction) and the bit line BL (BL1 to BLn) extending along the column (in the Y direction) are not illustrated for exposing the lower structure.

The variable resistance element 11 in the second embodiment is arranged commonly of a three-layer structure which comprises the lower electrode 13, a variable resistor 14, and the upper electrode 15 layered in this order. As previously described, the variable resistance element 11 in this embodiment is designed for shifting the resistance level from the first state to the second state when receiving the first write voltage between its two ports and shifting the resistance level from the second state to the first state when receiving between its two ports the second write voltage which is smaller in the absolute value than the first write voltage. Accordingly, the shape of the variable resistance element 11 and the material of its variable resistor 14 may be determined as desired. Preferably, the material of the variable resistor 14 is selected from the same materials as of the first embodiment which are preferable for ensuring the properties of enhancement.

The writing action and the reading action on each memory cell in the inventive device of the second embodiment will be described explicitly in conjunction with the arrangement of the memory cell shown in FIGS. 13 and 14.

Figure 15:
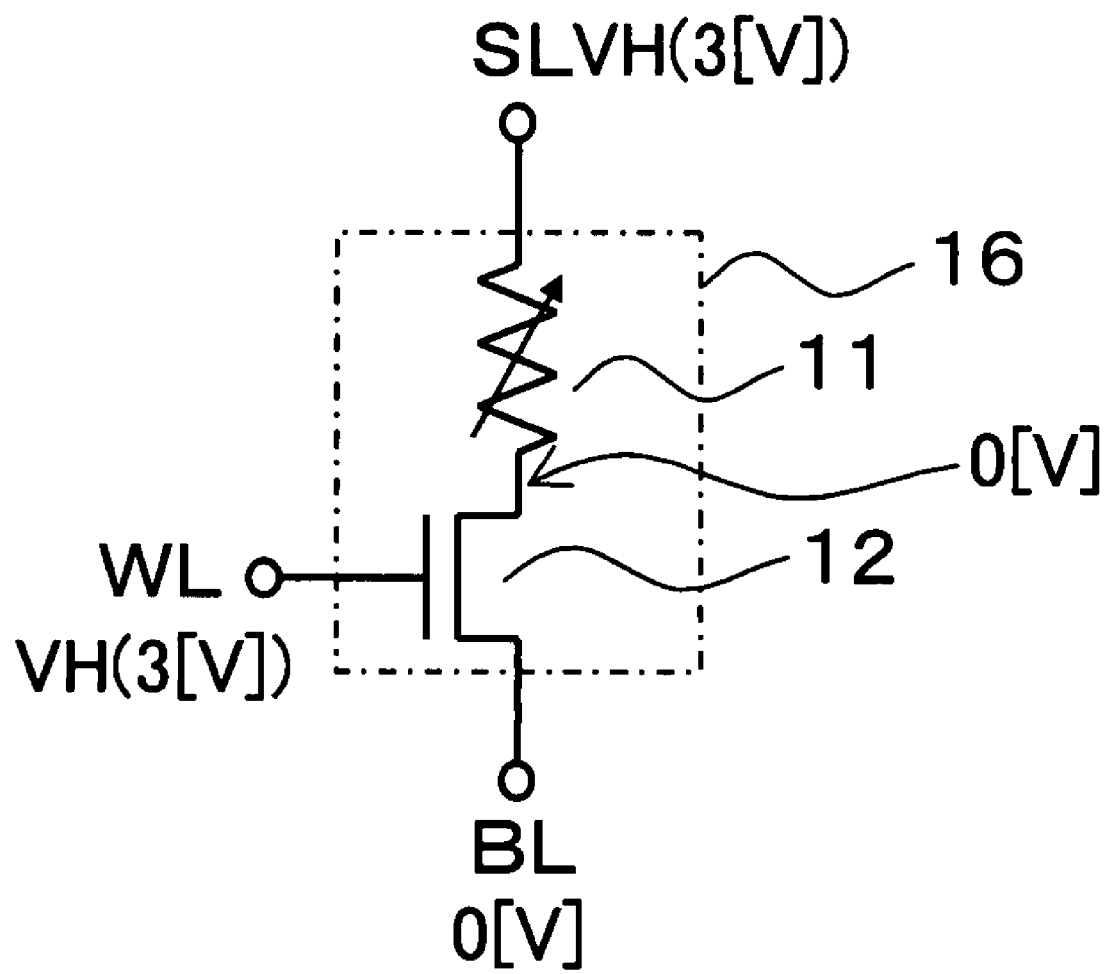
FIG. 15 is a view showing the voltage applying condition for subjecting each memory cell in the semiconductor memory device to the programming action (the first writing action) according to the second embodiment of the present invention.

FIG. 15 illustrates the voltage applying condition at the primary parts for the first writing action (the programming action) on the memory cell of the arrangement shown in FIGS. 13 and 14. The programming action starts with the memory cell 16 having the bit line BL supplied with 0 V (of the grounding voltage), the source line SL supplied with a voltage VH at +3 V for example, and the word line WL supplied with the voltage VH at +3 V which is higher than the threshold voltage Vth of the select transistor 12. At the time, because the select transistor 12 is an n-channel MOSFET, the grounding voltage of 0 V applied to the bit line BL is directly transferred to the source of the select transistor 12 (at the lower electrode of the variable resistance element 11), allowing the variable resistance element 11 to receive a negative voltage −VH (−3 V) with reference to the upper electrode. This permits the current path to be developed extending from the source line SL to the bit line BL, thus shifting the resistance state of the variable resistance element 11 from the low level (the first state) to the high level (the second state). Accordingly, the programming action on the memory cell 16 can be carried out using the voltage (first write voltage) at 3 V which is applied between the two ports of the variable resistance element 11 as being higher in the absolute value than that for the erasing action which will be explained later.

The voltage at 0 V applied to the bit line BL may be varied within a range from +1 V to −1 V. However, as the first write voltage is effected by the variation, the voltage applied to the source line SL has to be modified in the same way to hold the first write voltage at a constant level. Therefore, the voltage applied to the bit line BL is preferably 0 V. This allows the bit line BL to be supplied with 0 V of the grounding voltage which is common to the peripheral circuit in the inventive device.

Similarly, the voltage VH (+3 V for example) to be applied to the source line SL may be modified to a level ranging from +1 V to −1 V. However, for holding the first write voltage at a constant level, the voltage applied to the source line SL is preferably equal to VH. Since the voltage VH is commonly used for applying to the word line WL during the programming action, the inventive device can be decreased in the overall chip size through simplifying the its peripheral circuit. Moreover, when the voltage VH is equal to the level of a source voltage, a boosting circuit for boosting the voltage VH will hardly be needed.

Figure 16:
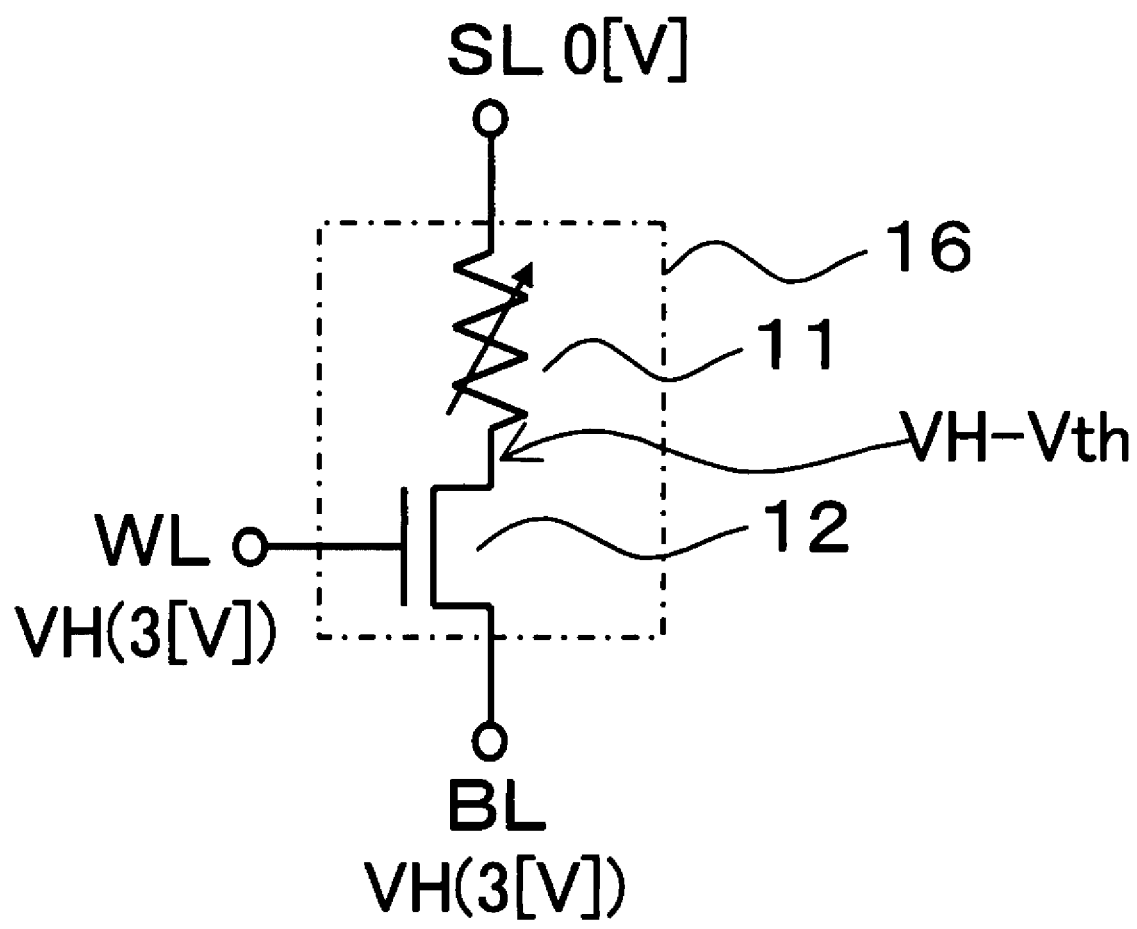
FIG. 16 is a view showing the voltage applying condition for subjecting each memory cell in the semiconductor memory device to the erasing action (the second writing action) according to the second embodiment of the present invention.

FIG. 16 illustrates the second writing action (the erasing action) on the memory cell of the arrangement shown in FIGS. 13 and 14 with the voltage applying condition at the primary parts. The erasing action starts with the memory cell 16 having the source line SL supplied with 0 V (of the grounding voltage), the bit line BL supplied with a voltage VH at +3 V for example, and the word line WL supplied with the voltage VH at +3 V which is higher than the threshold voltage Vth of the select transistor 12. At the time, the variable resistance element 11 is supplied at its select transistor 12 side (or the lower electrode) with a difference (VH−Vth), +2.1 V for example, between the gate electrode VH (+3 V) and the threshold voltage Vth of the select transistor 12. The voltage (VH−Vth) applied to between the two ports of the variable resistance element 11 is as positive as +2.1 V with reference to the upper electrode. This allows the current path to be developed extending from the bit line BL to the source line SL, thus shifting the resistance state of the variable resistance element 11 from the high level (the second state) to the low level (the first state). Accordingly, the erasing action of the memory cell 16 can be carried out using the voltage (the second write voltage) at +2.1 V between the two ports of the variable resistance element 11 which is lower in the absolute value than that for the programming action.

The voltage at 0 V applied to the source line SL may be varied within a range from +1 V to −1 V. However, as the first write voltage is effected by the variation, the voltage applied to the word line WL has to be modified in the same way to hold the second write voltage at a constant level. Therefore, the voltage applied to the source line SL is preferably 0 V This allows the source line SL to be supplied with 0 V of the grounding voltage which is common to the peripheral circuit in the inventive device.

Similarly, the voltage VH (+3 V for example) to be applied to the bit line BL may be varied within a range equal to the threshold voltage Vth of the select transistor 12. However, if the voltage VH is commonly used for applying to the word line WL during the erasing action, the inventive device can be decreased in the overall chip size through simplifying the its peripheral circuit. Moreover, when the voltage VH is equal to the level of a source voltage, a boosting circuit for boosting the voltage VH will hardly be needed.

Furthermore, since the voltage VH to be applied to both the source line SL and the word line WL for the programming action is equal to the voltage VH to be applied to both the bit line BL and the word line WL for the erasing action, the programming action and the erasing action can share the voltage VH, thus allowing the inventive device to be decreased in the overall chip size through simplifying the its peripheral circuit which includes a voltage generator circuit.

The absolute of the first write voltage to be applied to between the two ports of the variable resistance element for the programming action is determined by the voltage VH applied to the source line SL. While the voltage VH is set depending on the first write voltage, the second write voltage (VH−Vth) applied to between the two ports of the variable resistance element for the erasing action is determined by the threshold voltage Vth of the select transistor. Accordingly, the asymmetry of both the first and second write voltages can be controlled with the threshold voltage Vth of the select transistor. This permits the voltage VH to be applied to both the source line SL and the word line WL for the programming action and the voltage VH to be applied to both the bit line BL and the word line WL for the erasing action to be compatible to each other.

Figure 17:
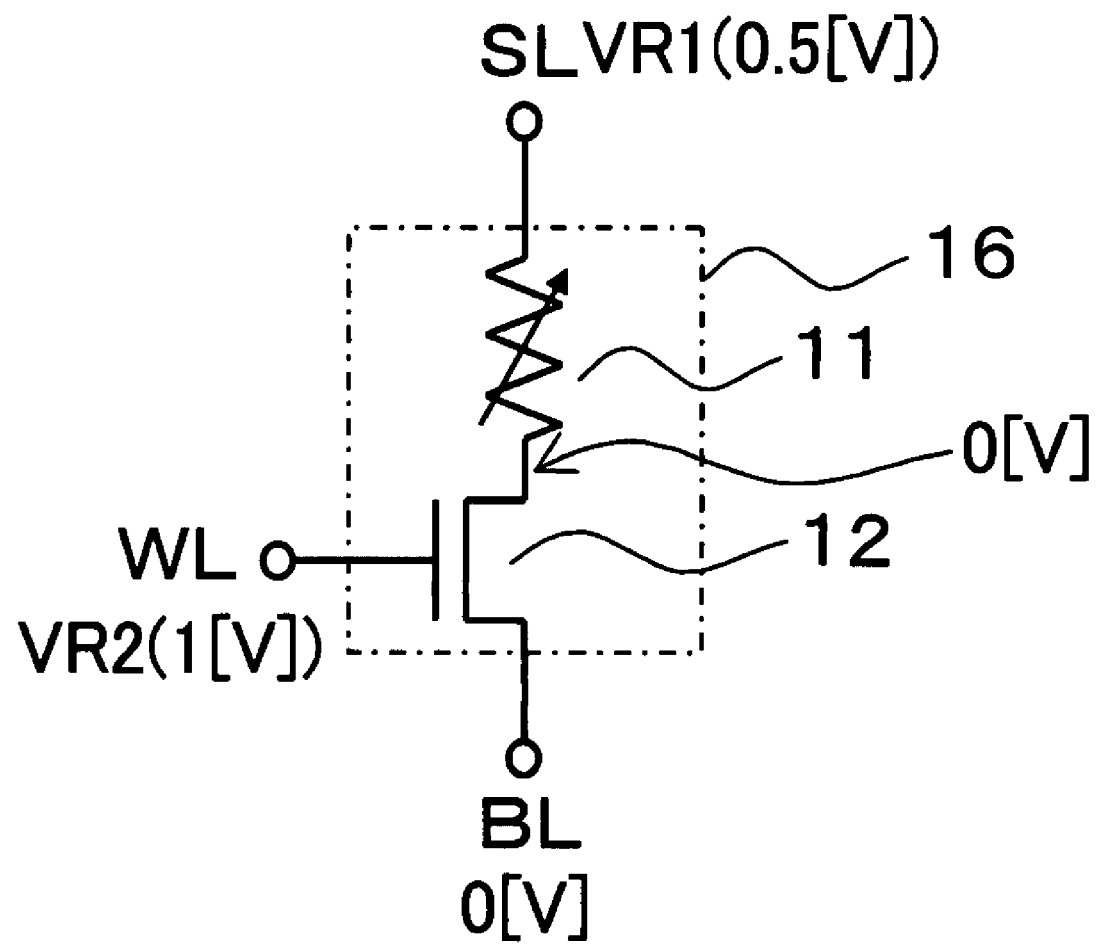
FIG. 17 is a view showing the voltage applying condition for subjecting each memory cell in the semiconductor memory device to the reading action according to the second embodiment of the present invention.

FIG. 17 illustrates the reading action on the memory cell of the arrangement shown in FIGS. 13 and 14 with the voltage applying condition at the primary parts. The reading action starts with the memory cell 16 having the bit line BL supplied with 0 V (of the grounding voltage), the source line SL supplied with a readout voltage VR1 (a third voltage) at +0.5 V for example, and the word line WL supplied with a voltage VR2 at +1.0 V which is higher than the threshold voltage Vth of the select transistor 12. At the time, the select transistor 12 of an n-channel MOSFET is turned on and 0 V (of the grounding voltage) applied to the bit line BL is applied to the lower electrode of the variable resistance element 11 through the select transistor and the readout voltage VR1 (0.5 V for example) is applied to the upper electrode of the variable resistance element 11 through the source line SL. This allows the readout current to run from the upper electrode to the lower electrode corresponding to the resistance state of the variable resistance element and from the source line SL to the bit line BL. Accordingly, the resistance state of the variable resistance element or the information stored in the memory cell can be read out through measuring the readout current.

The polarity of the readout voltage VR1 to be applied to between the two ports of the variable resistance element is negative with reference to the upper electrode and equal to the first write voltage (−VH) applied to between the two ports of the variable resistance element during the programming action. A difference (VH−VR1) between (the absolute values of) the two voltages is hence 2.5 V (=3V−0.5V). If the readout voltage VR1 is positive with reference to the upper electrode and different from that of this embodiment, it is equal in the polarity to the second write voltage (VH−Vth) applied to between the two ports of the variable resistance element during the erasing action. Accordingly, a difference (VH−Vth−VR1) (of the absolute value) between the second write voltage and the readout voltage is as low as 1.6 V (=2.1V−0.5V), and thus a difference between the write voltage and the readout voltage becomes low and the possibility of the loss of stored information during the reading action increases. This embodiment permits the readout voltage to be supplied at the same polarity as of the write voltage (for the programming action in the second embodiment) which is greater in the absolute value than the other, whereby the loss of stored information will be triggered at less possibility.

Figure 18:
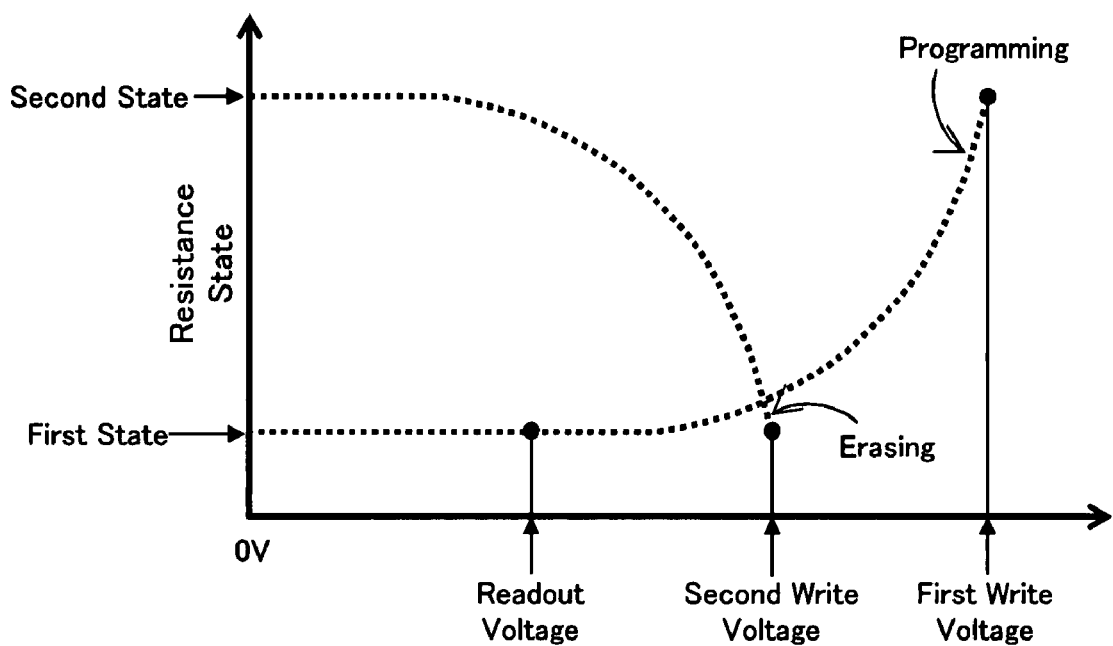
FIG. 18 is a profile showing the relationship between the resistance level in the variable resistance element and (the absolute value of) the voltage applied to the variable resistance element between the two ports for the programming action, the erasing action, and the reading action in the semiconductor memory device according to the second embodiment of the present invention.

FIG. 18 illustrates a profile of the relationship between the resistance state of the variable resistance element and (the absolute value of) the voltage which is applied to between the two ports of the variable resistance element during the programming, erasing, and reading actions. As shown in FIG. 18, when receiving between the two ports the second write voltage (VH−Vth) at the positive polarity with reference to the upper electrode, the variable resistance element shifts its resistance state from the high level (the second state) to the low level (the first state) for carrying out the erasing action. Also, when receiving between the two ports the first write voltage (−VH) at the negative polarity with reference to the upper electrode, which is greater in the absolute value than the second write voltage, the variable resistance element shifts its resistance state from the low level (the first state) to the high level (the second state) for carrying out the programming action. Since the readout voltage (−VR1) to be applied to between the two ports of the variable resistance element during the reading action is equal in the polarity to the first write voltage (−VH) applied to between the two ports of the variable resistance element for conducting the programming action, it may cause the resistance state of the variable resistance element to shift from the low level (the first state) to the high level (the second state) for carrying out the reading action. Accordingly, a difference between the readout voltage and the first write voltage (−VH) is made sufficiently, a change in the resistance state can be minimized. Meanwhile, as the readout voltage (−VR1) to be applied to between the two ports of the variable resistance element during the reading action is opposite in the polarity to the second write voltage (VH−Vth) applied to between the two ports of the variable resistance element for conducting the erasing action, it disallows the resistance state of the variable resistance element to shift from the high level (the second state) to the low level (the first state).

The voltage applying condition at the word lines WL1 to WLm, the bit lines BL1 to BLn, and the source lines SL in the memory cell array 40 shown in FIG. 13 during the writing action (the programming action and the erasing action) and the reading action at the memory cell basis will be described.

Figure 19:
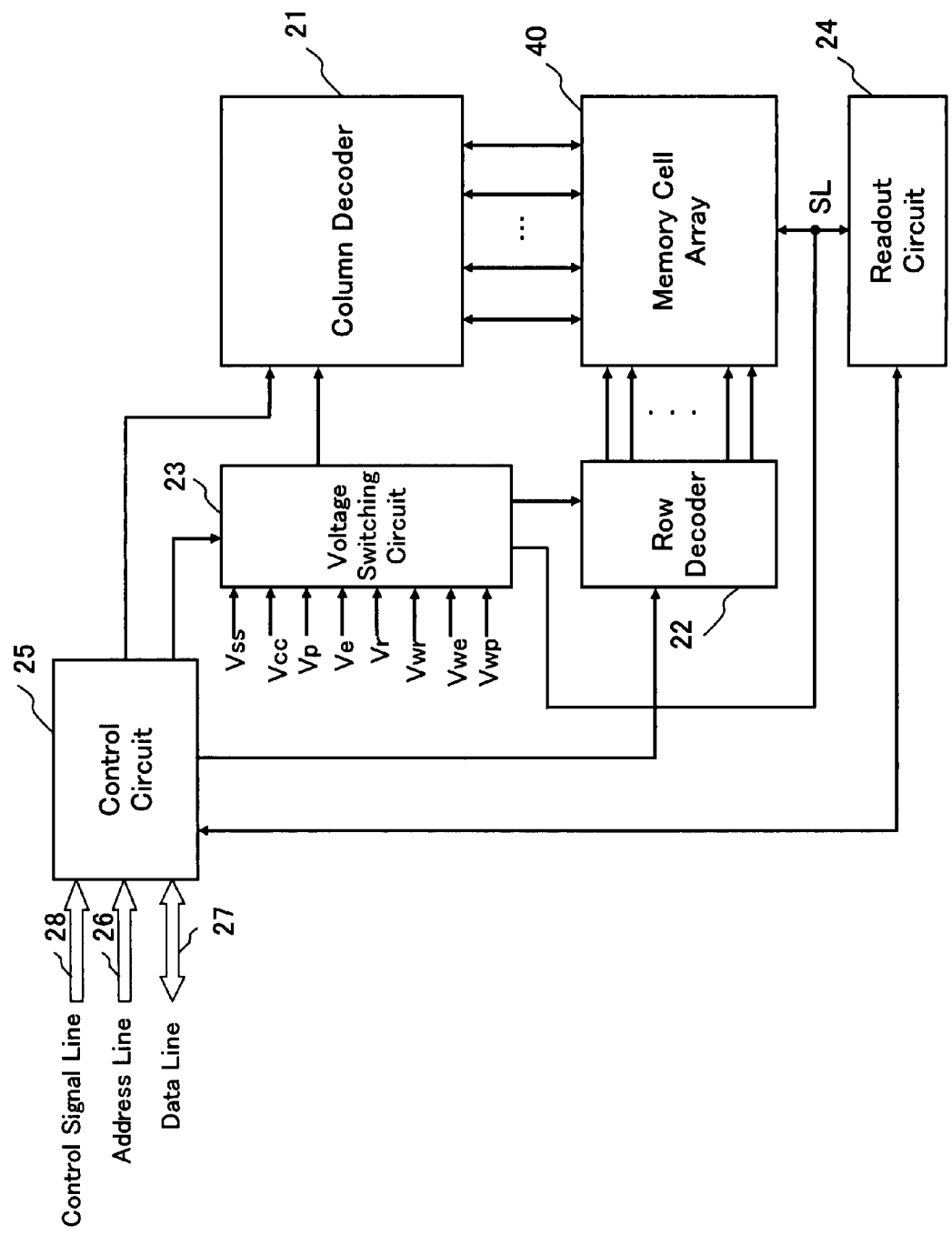
FIG. 19 is a block diagram schematically showing a circuitry arrangement of the semiconductor device according to the second embodiment of the present invention.

The description starts with the peripheral circuit in the inventive device of the second embodiment designed for applying the voltages described later to each of the word lines WL1 to WLm, each of the bit lines BL1 to BLn, and each of the source lines SL. FIG. 19 schematically illustrates an exemplary arrangement of the peripheral circuit in the inventive device of the second embodiment.

As shown in FIG. 19, the memory cell array 40 of the inventive device shown in FIG. 2 is accompanied with a column decoder 21, a row decoder 22, a voltage switching circuit 23, a readout circuit 24, and a control circuit 25. The column decoder 21, the row decoder 22, the voltage switching circuit 23, the readout circuit 24, and the control circuit 25 are identical in the function and circuitry action to those in the peripheral circuit in the first embodiment shown in FIG. 9 and will be explained in no more detail. The second embodiment is differentiated from the first embodiment by the fact that the memory cell array 40 is modified in the arrangement and the readout circuit 24 is provided at a particular location. The difference of the memory cell array 40 from the memory cell array 20 in the first embodiment is as described.

For the reading action with the first embodiment, the readout circuit 24 is connected to the column decoder 21 in order to measure the readout current supplied at the positive value from the bit line. In the second embodiment, the readout circuit 24 is connected to the source line for measuring the readout voltage at the positive value supplied from the source line. More specifically, the readout circuit 24 measures and compares the readout current running from the source line across the selected memory cell to the selected bit line determined by the column decoder 21, directly or after conversion to a voltage form, with a reference current or a reference voltage thus to judge the state of stored information (the resistance state) in the memory cell. A result of the judgment is transferred to the control circuit 25 and then released from the data line 27.

Figure 20:
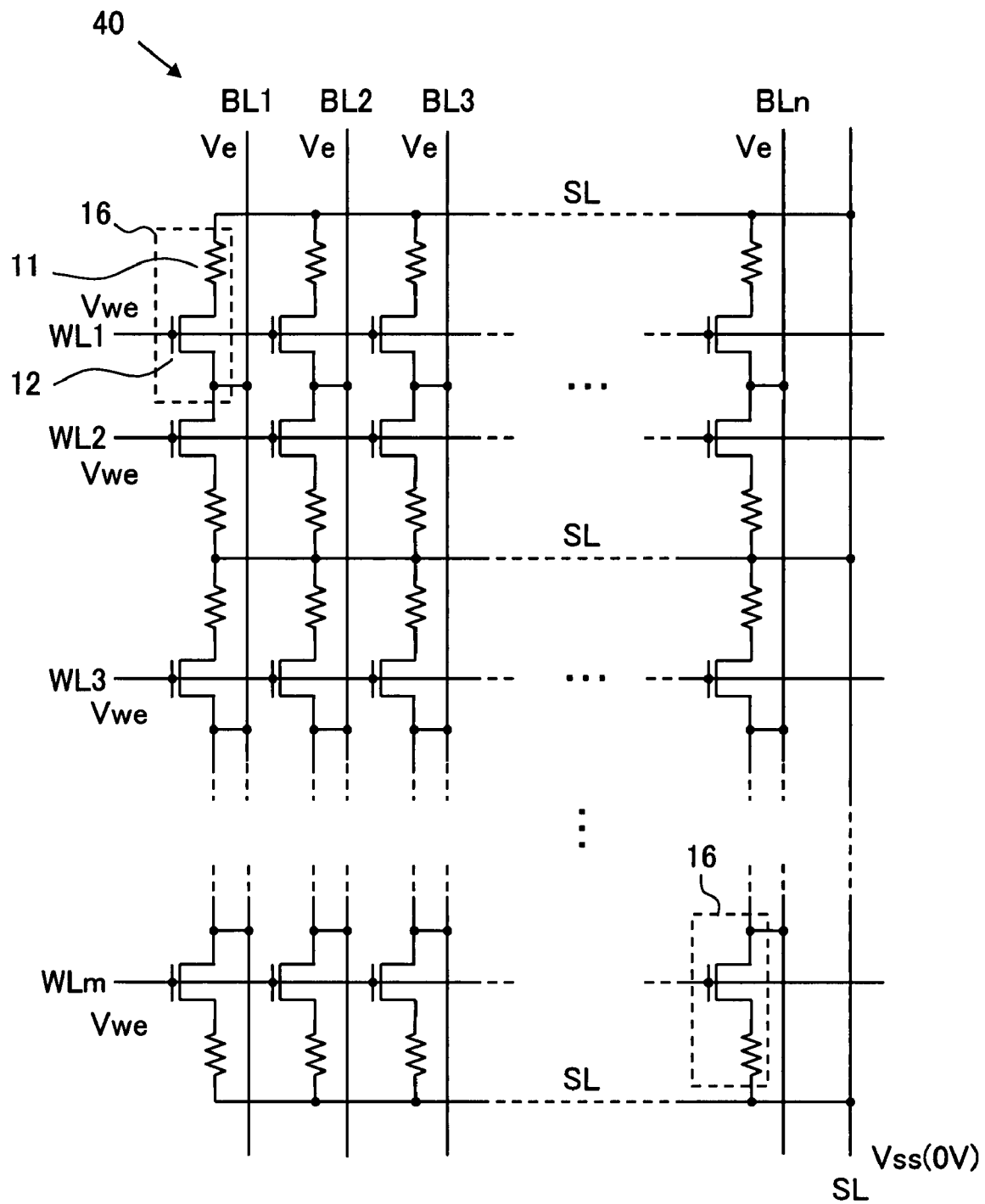
FIG. 20 is a view showing the voltage applying condition for conducting the erasing action (the second writing action) on the semiconductor memory device according to the second embodiment of the present invention.

The voltage applying condition for subjecting the memory cell array 40 to a batch erasing action will be described. The action of erasing the memory cell array 40 at once starts with the row decoder 22 selecting all the word lines WL1 to WLm as selected word lines and applying the predetermined selected word line voltage Vwe (=VH, 3 V for example) thereto as shown in FIG. 20. Simultaneously, the column decoder 21 selects all the bit lines BL1 to BLn as selected bit lines and applies the erase voltage Ve (=VH, 3 V for example) thereto. Also, the source lines SL are supplied with 0 V (of the grounding voltage Vss). Accordingly, the select transistors in the memory cells are turned on, the erase voltage Ve applied to the bit lines BL1 to BLn is applied to the lower electrode of the corresponding variable resistance element through the select transistor up to a difference (Vwe−Vth) between the gate voltage Vwe and the threshold voltage Vth of the select transistor and at the same time, 0 V (of the grounding voltage Vss) is applied to the upper electrodes through the source lines SL. The variable resistance elements are hence supplied with the positive voltage (Vwe−Vth) at the lower electrodes with reference to the upper electrodes, thus subjecting all the memory cells in the memory cell array at once to the erasing action similar to that for each memory cell shown in FIG. 16 and shifting the resistance state of each variable resistance element from the second state (the high level) to the first state (the low level). The pulse width of pulses of the erase voltage Ve (a duration of the voltage application for completing the erasing action) is determined by an overlapping period between the duration of application of the selected word line voltage Vwe applied to the word lines WL1 to WLm and the duration of application of the erase voltage Ve applied to the bit lines BL1 to BLn. In other words, the application of the selected word line voltage Vwe and the application of the erase voltage Ve may be carried out with either starting earlier or ending later.

When a group of the memory cells in the memory cell array 40, for example, along one or more rows are subjected to the batch erasing action, corresponding one or more of the word lines connected to the memory cells to be erased are selected and supplied with the selected word line voltage Vwe while the other unselected word lines remain supplied with 0 V (of the grounding voltage Vss). Accordingly, the select transistors of the selected memory cells connected to the selected word lines are turned on, thus allowing the lower electrodes of their corresponding variable resistance elements to receive the positive voltage (Vwe−Vth) with reference to the upper electrodes. As the result, a desired group of the memory cells along one or more of the rows in the memory cell array 40 can be subjected at once to the erasing action. Alternatively, the row decoder 22 may be modified to have an additional function for selecting a desired number of the word lines, if desired so.

Also, when another group of the memory cells in the memory cell array 40, for example, along one or more columns are subjected to the batch erasing action, corresponding one or more of the bit lines connected to the memory cells to be erased are selected and supplied with the erase voltage Ve while the other unselected bit lines remain supplied with 0 V (of the grounding voltage Vss) or at the floating state (under high impedance). This allows the lower electrodes of their corresponding variable resistance elements in the selected memory cells connected to the selected bit lines to receive the positive voltage (Vwe−Vth) with reference to the upper electrodes. As the result, a desired group of the memory cells along one or more of the columns in the memory cell array 40 can be subjected at once to the erasing action. Alternatively, the column decoder 21 may be modified to have an additional function for selecting a desired number of the bit lines, if desired so.

Moreover, when a further group of the memory cells in the memory cell array 40, for example, along one or more rows and columns are subjected to the batch erasing action, corresponding one or more of the word lines connected to the memory cells of interest along the desired row or rows are selected and supplied with the selected word line voltage Vwe while the other unselected word lines remain supplied with 0 V (of the grounding voltage Vss). At the same time, corresponding one or more of the bit lines connected to the memory cells of interest along the desired column or columns are selected and supplied with the erase voltage Ve while the other unselected bit lines remain supplied with 0 V (of the grounding voltage Vss) or at the floating state. This allows the lower electrodes of their corresponding variable resistance elements in the selected memory cells to be erased to receive the positive voltage (Vwe−Vth) with reference to the upper electrodes. As the result, a desired group of the memory cells along one or more of combinations of the rows and columns in the memory cell array 40 can be subjected at once to the erasing action.

Figure 21:
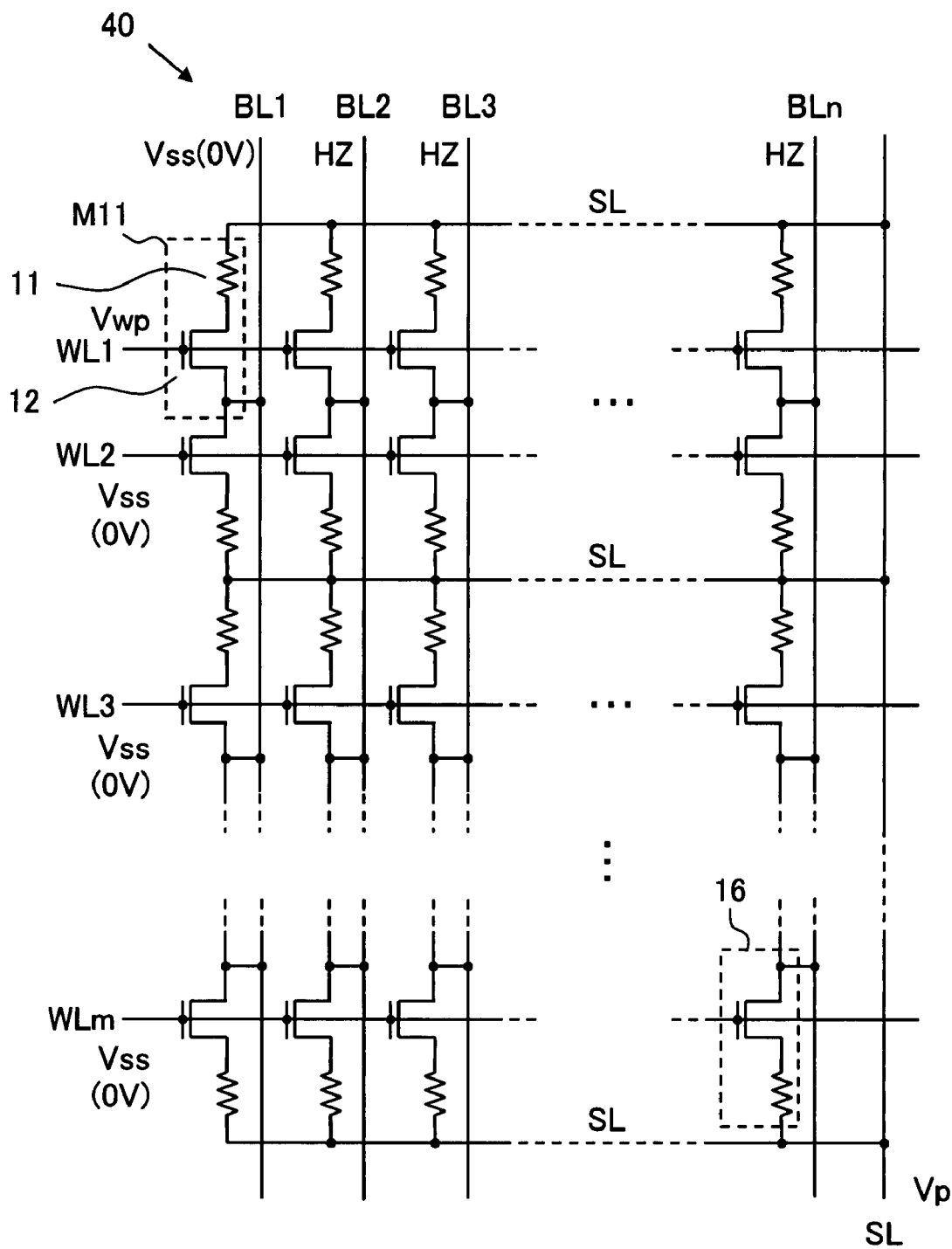
FIG. 21 is a view showing the voltage applying condition for conducting the programming action (the first writing action) on the semiconductor memory device according to the second embodiment of the present invention.

The voltage applying condition for conducting the programming action (first writing action) on each memory cell in the memory cell array 40 will now be described. Assuming that desired one of the memory cells denoted by M11 and connected to the word line WL1 and the bit line BL1 as shown in FIG. 21, the action of programming starts with the row decoder 22 selecting the word line WL1 as a selected word line and applying the predetermined selected word line voltage Vwp (=VH, 3 V for example) thereto while the other unselected word lines WL2 to WLm remain supplied with 0 V (of the grounding voltage Vss). Simultaneously, the column decoder 21 selects the bit line BL1 as a selected bit line and applies 0 V (of the grounding voltage Vss) thereto while the other unselected bit lines BL2 to BLn remain at the floating state (under high impedance). Also, the source line SL is supplied with the program voltage Vp (=VH, 3 V for example). Accordingly, the select transistor in the memory cell M11 is turned on, allowing the lower electrode of the corresponding variable resistance element to receive 0 V from the bit line BL1 and at the same time, the upper electrode of the same variable resistance element to receive the program voltage Vp (=VH, 3 V for example) through the source line SL. The variable resistance element in the selected memory cell M11 is hence supplied at the lower electrode with the negative voltage (−Vp) with reference to the upper electrode, thus subjecting the memory cell M11 in the memory cell array shown in FIG. 15 to the programming action and shifting the resistance state of the variable resistance element in the memory cell M11 from the first state (the low level) to the second state (the high level).

The pulse width of pulses of the program voltage (a duration of the voltage application for completing the programming action) is determined by a overlapping period between the duration of application of the selected word line voltage Vwp applied to the word line WL1 and the duration of application of the program voltage Vp applied to the source line SL. In other words, the application of the selected word line voltage Vwp and the application of the program voltage Vp may be carried out with either starting earlier or ending later.

The voltage applying condition for conducting the programming action (first writing action) on a group of the memory cells in the memory cell array 40 may be satisfied when the memory cells to be subjected at once to the programming action are aligned along one row or column. The action of programming a group of the memory cells aligned along one row, for example, starts with applying the predetermined selected word line voltage Vwp (3 V for example) to the word line selected by the row decoder 22 while the other unselected word lines remain supplied with 0 V (of the grounding voltage Vss), similar to the action of programming each memory cell. Simultaneously, the column decoder 21 selects the corresponding bit lines connected to the memory cells to be subjected to the programming action as selected bit lines and applies 0 V (of the grounding voltage Vss) thereto while the other unselected bit lines remain at the floating state (under high impedance). Also, the source line SL is supplied with the program voltage Vp (3 V for example). This allows the selected memory cells to receive the negative voltage (−Vp) at the lower electrode with reference to the upper electrode, thus subjecting the group of memory cells at once to the programming action similar to that for each memory cell shown in FIG. 15 and shifting the resistance state of the variable resistance element in each of the memory cells from the first state (the low level) to the second state (the high level). Similarly, the action of writing a group of the memory cells aligned along one column, for example, starts with the row decoder 22 selecting the corresponding word lines connected to the memory cells to be subjected to the programming action as selected word lines and applies the predetermined selected word line voltage Vwp (3 V for example) thereto while the other unselected word lines remain supplied with 0 V (of the grounding voltage Vss). Simultaneously, the bit line selected by the column decoder 21 is supplied with 0 V (of the grounding voltage Vss) while the other unselected bit lines remain at the floating state (under high impedance). Also, the source lines SL are supplied with the program voltage Vp (3 V for example). This allows the selected memory cells to receive the negative voltage (−Vp) at the lower electrode with reference to the upper electrode, thus subjecting the group of memory cells at once to the first writing action similar to that for each memory cell shown in FIG. 15 and shifting the resistance state of the variable resistance element in each of the memory cells from the first state (the low level) to the second state (the high level).

Figure 22:
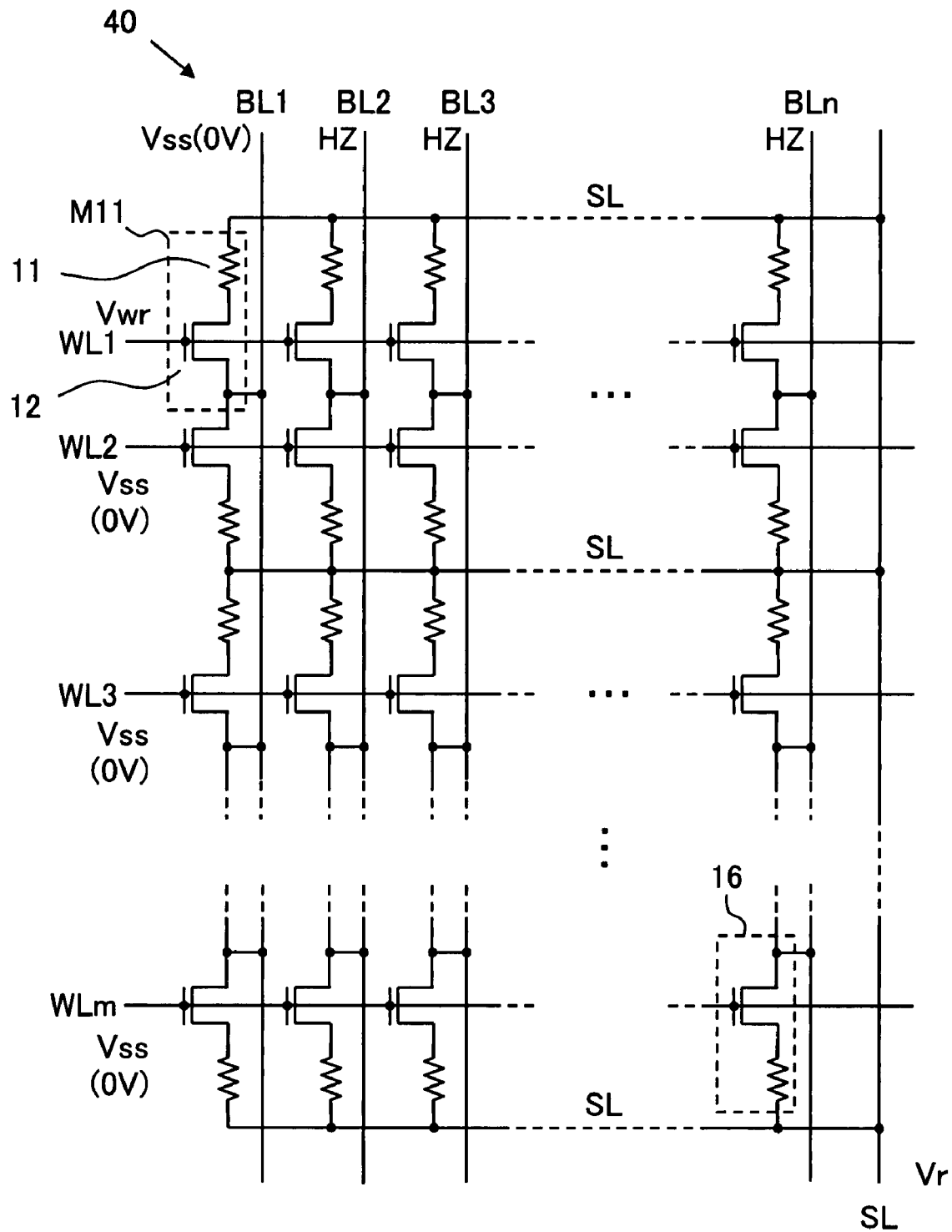
FIG. 22 is a view showing the voltage applying condition for conducting the reading action on the semiconductor memory device according to the second embodiment of the present invention.
Figure 23:
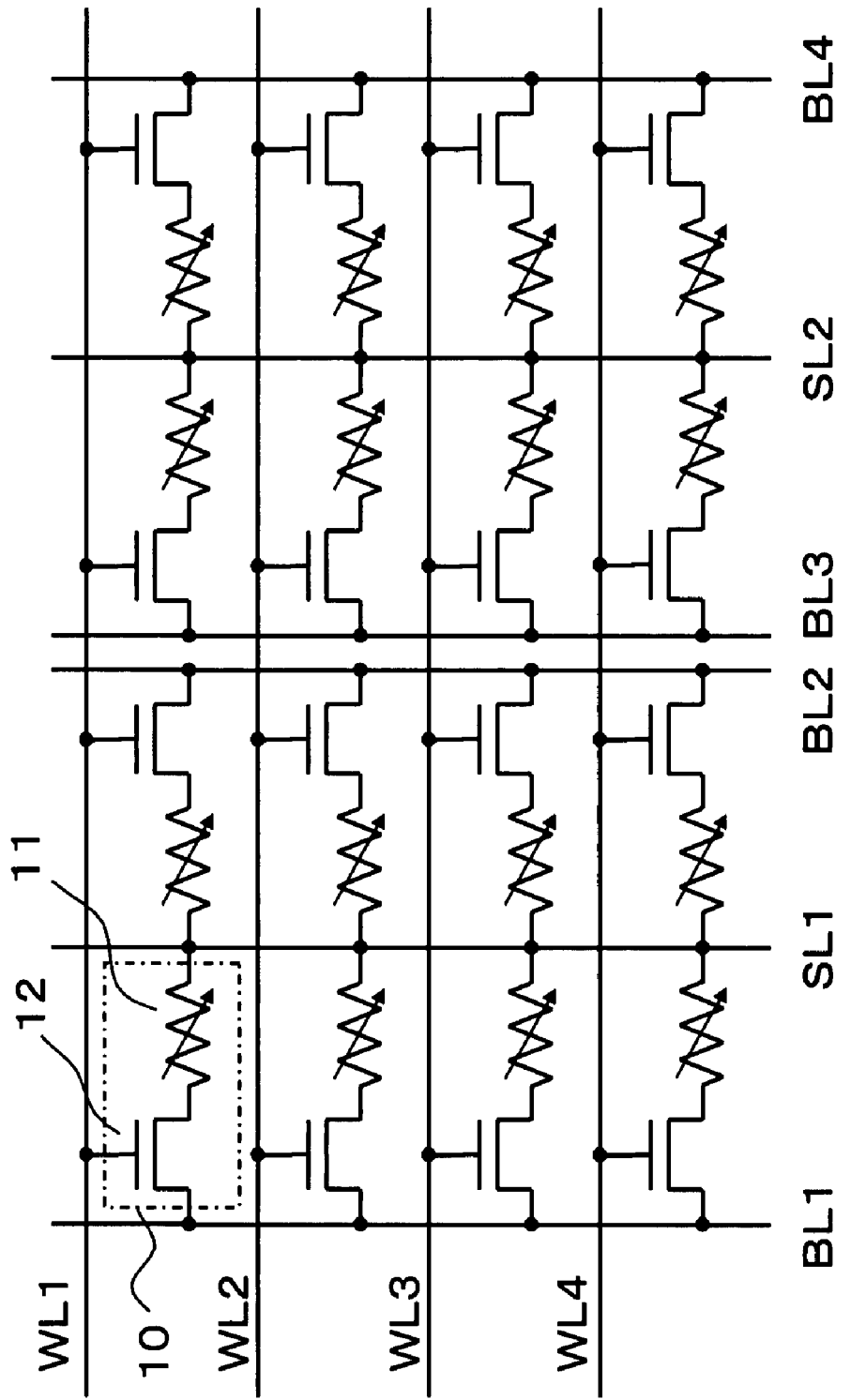
FIG. 23 is a circuitry diagram schematically showing an arrangement of the memory cell array provided with variable resistance elements in the prior art.

The voltage applying condition for conducting the reading action on each memory cell in the memory cell array 40 will now be described. Assuming that the memory cells denoted by M11 connected to the word line WL1 and the bit line BL1 is the target of the reading action as shown in FIG. 22, the action of reading starts with the row decoder 22 selecting the word line WL1 as a selected word line and applying the predetermined selected word line voltage Vwr (1.0 V for example) thereto while the other unselected word lines WL2 to WLm remain supplied with 0 V (of the grounding voltage Vss). Simultaneously, the column decoder 21 selects the bit line BL1 as a selected bit line and applies 0 V (of the grounding voltage Vss) thereto while the other unselected bit lines BL2 to BLn remain at the floating state (under high impedance) or supplied with the readout voltage Vr (0.5 V for example). Also, the source line SL is supplied with the readout voltage Vr (0.5 V for example). Accordingly, the select transistor in the memory cell M11 is turned on, allowing the corresponding variable resistance element to receive at the lower electrode 0 V (of the grounding voltage Vss) through the bit line BL1 and at the upper electrode the readout voltage Vr (0.5 V for example) through the source line SL at the same time. This allows the readout current to flow from the upper electrode to the lower electrode depending on the resistance state of the variable resistance element in the selected memory cell M11 and more particularly from the source line SL to the selected bit line BL1. As the result, the data stored in the selected memory cell M11 can be read out by the readout circuit 24 measuring the readout current from the source line SL. The voltage applying condition for the reading action may be applied with equal success to the verifying action which is associated with the erasing action and the programming action.

OTHER EMBODIMENTS

Other embodiment of the inventive device will be described.

(1) While the memory cell array 20 in the first embodiment shown in FIG. 1 is arranged with the writing voltage attribute of the variable resistance elements allowing the absolute value of the second write voltage to be greater than the absolute value of the first write voltage, the write voltage attribute may be modified where the absolute value of the first write voltage is greater than the absolute value of the second write voltage. In the latter case, the voltage applying condition for conducting the reading action may be set equal to that provided in the second embodiment. It is however necessary during the programming action to modify the gate voltage of the select transistor for supplying the two ports of the variable resistance element in each selected memory cell with the first write voltage of the greater absolute value in consideration with a drop in the threshold voltage of the select transistor.

(2) While the memory cell array 40 in the second embodiment shown in FIG. 13 is arranged with the writing voltage attribute of the variable resistance elements allowing the absolute value of the second write voltage to be smaller than the absolute value of the first write voltage, the write voltage attribute may be modified where the absolute value of the first write voltage is smaller than the absolute value of the second write voltage. In the latter case, the voltage applying condition for conducting the reading action may be set equal to that provided in the first embodiment. It is however necessary during the erasing action to modify the gate voltage of the select transistor for supplying the two ports of the variable resistance element in each selected memory cell with the second write voltage of the greater absolute value in consideration with a drop in the threshold voltage of the select transistor.

(3) Although the readout circuit 24 in the second embodiment is connected directly to the source line SL, it may be connected to the column decoder 21 similar to that in the first embodiment. In the latter case, the readout circuit 24 has to be arranged to measure the readout current which runs in a direction opposite to the direction in the first embodiment.

(4) While the source line SL is supplied with a positive voltage by applying 0 V to the bit line BL in each of the foregoing embodiments, the bit line BL may be supplied with a negative voltage through applying 0 V to the source line SL. This allows the source line SL to remain supplied with 0 V. However, since the negative voltage has to be provided separately, the peripheral circuit may be intricate in the arrangement.

(5) Although the above description is made using the single memory cell array 20 for ease of the understanding, not only one but also two or more of the memory cell arrays 20 may be provided with equal success.

(6) It would be understood that the voltage settings described in the foregoing embodiments are illustrative and that the voltage applying conditions and the threshold voltages used in the inventive device are not limited to the above described voltage settings.

The semiconductor memory device according to the present invention is hence applicable in the form of a semiconductor memory device which comprises an array of memory cells, each memory cell including a variable resistance element of two-port structure type arranged where a piece of information can be stored by varying its resistance level between the first state and the second state with voltages at different polarities applied to the two ports respectively and a select transistor connected at either the source or the drain to one of the two ports of the variable resistance element.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:

an array of memory cells arranged in a row direction and a column direction, each memory cell including a series circuit of a variable resistance element of two-port structure type and a select transistor of MOSFET type, the select transistor connected at its drain or source to one port of the variable resistance element, the select transistors in the memory cells aligned along one row connected at its gate to a common word line extending along the row direction, the memory cells aligned along one column connected at its one end to a common bit lines extending along the column direction, each of the memory cells connected at the other end to a source line extending along the row direction or the column direction; and a voltage applying circuit for selecting one or more of the memory cells from the memory cell array and applying predetermined voltages to the word line, bit line, and source line to conduct actions of writing and reading information stored in a selected memory cell, wherein the variable resistance element is a nonvolatile memory element capable of storing and writing information electrically by shifting an electric resistance level from a first state to a second state when a first write voltage is applied to between the two ports and shifting the electric resistance level from the second state to the first state when a second write voltage which is different in polarity and an absolute value from the first write voltage is applied to between the two ports, and in a first writing action of shifting an electric resistance in the variable resistance element in the selected memory cell from the first state to the second state, the voltage applying circuit applies a first voltage at positive or negative polarity to between the bit line and the source line both connected to the selected memory cell with reference to the source line and a predetermined word line voltage to the word line connected to the gate of the select transistor in the selected memory cell and thus applies the first write voltage to between the two ports of the variable resistance element in the selected memory cell, in a second writing action of shifting the electric resistance in the variable resistance element in the selected memory cell from the second state to the first state, the voltage applying circuit applies a second voltage which is opposite in the polarity to the first voltage to between the bit line and the source line both connected to the selected memory cell with reference to the source line and a predetermined word line voltage to the word line connected to the gate of the select transistor in the selected memory cell and thus applies the second write voltage to between the two ports of the variable resistance element in the selected memory cell, and in the reading action, the voltage applying circuit applies a third voltage equal in the polarity to a reference write voltage, which is either the first write voltage for the first writing action or the second write voltage for the second writing action whichever is greater in the absolute value, to between the bit line and the source line both connected to the selected memory cell with reference to the source line and a predetermined word line voltage to the word line connected to the gate of the select transistor in the selected memory cell and thus applies a readout voltage which is lower in the absolute value than the reference write voltage to between the two ports of the variable resistance element in the selected memory cell.

2. The semiconductor memory device according to claim 1, wherein the memory cell includes a series circuit where the variable resistance element is connected at its one port to the source of the select transistor, each of the select transistors in the memory cells aligned along one column is connected at its drain to the common bit line and each of the variable resistance elements in the memory cells is connected at the other port to the source line in the memory cell array, the variable resistance element is a nonvolatile memory element for shifting the electric resistance level from a first state to a second state when receiving a first write voltage between the two ports and shifting the electric resistance level from the second state to the first state when receiving a second write voltage which is opposite in the polarity to and smaller in the absolute value than the first write voltage between the two ports, and thus can electrically store and write information, and in the first writing action, the voltage applying circuit applies a first voltage at the positive polarity with reference to the bit line to between the bit line and the source line both connected to the selected memory cell and a predetermined word line voltage to the word line connected to the gate of the select transistor in the selected memory cell, and thus applies the first write voltage to between the two ports of the variable resistance element in the selected memory cell, in the second writing action, the voltage applying circuit applies a second voltage at the positive polarity with reference to the source line to between the bit line and the source line both connected to the selected memory cell and a predetermined word line voltage to the word line connected to the gate of the select transistor in the selected memory cell, and thus applies the second write voltage to between the two ports of the variable resistance element in the selected memory cell, and in the reading action, the voltage applying circuit applies a third voltage at the positive polarity with reference to the bit line to between the bit line and the source line both connected to the selected memory cell and a predetermined word line voltage to the word line connected to the gate of the select transistor in the selected memory cell, and thus applies the readout voltage which is lower in the absolute value than the first write voltage to between the two ports of the variable resistance element in the selected memory cell.

3. The semiconductor memory device according to claim 2, wherein the voltage applying circuit applies a grounding voltage to the bit line in the first writing action and the reading action, and the grounding voltage to the source line in the second writing action.

4. The semiconductor memory device according to claim 1, wherein the memory cell includes a series circuit where the variable resistance element is connected at the one port to the drain of the select transistor, each of the select transistors in the memory cells aligned along one column is connected at its source to the common source line and each of the variable resistance elements in the memory cells is connected at the other port to the bit line in the memory cell array, the variable resistance element is a nonvolatile memory element for shifting the electric resistance level from a first state to a second state when receiving a first write voltage between the two ports and shifting the electric resistance level from the second state to the first state when receiving a second write voltage which is opposite in the polarity to and greater in the absolute value than the first write voltage between the two ports, and thus can electrically store and write information, and in the first writing action, the voltage applying circuit applies a first voltage at the positive polarity with reference to the bit line between the bit line and the source line both connected to the selected memory cell and a predetermined word line voltage to the word line connected to the gate of the select transistor in the selected memory cell, and thus applies the first write voltage to between the two ports of the variable resistance element in the selected memory cell, in the second writing action, the voltage applying circuit applies a second voltage at the positive polarity with reference to the source line to between the bit line and the source line both connected to the selected memory cell and a predetermined word line voltage to the word line connected to the gate of the select transistor in the selected memory cell, and thus applies the second write voltage to between the two ports of the variable resistance element in the selected memory cell, and in the reading action, the voltage applying circuit applies a third voltage at the positive polarity with reference to the source line to between the bit line and the source line both connected to the selected memory cell and a predetermined word line voltage to the word line connected to the gate of the select transistor in the selected memory cell, and thus applies the readout voltage which is lower in the absolute value than the second write voltage to between the two ports of the variable resistance element in the selected memory cell.

5. The semiconductor memory device according to claim 4, wherein the voltage applying circuit applies a grounding voltage to the bit line in the first writing action and the grounding voltage to the source line in the second writing action and the reading action.

6. The semiconductor memory device according to claim 1, wherein the select transistor is an n-channel MOSFET of enhancement type.

7. The semiconductor memory device according to claim 1, wherein a gate insulating layer of the select transistor has the same thickness as a transistor gate insulating layer of a transistor constituting peripheral circuits including the voltage applying circuit.

* * * * *